(12) United States Patent
Johnston et al.

(10) Patent No.: US 12,061,422 B2
(45) Date of Patent: *Aug. 13, 2024

(54) METHOD FOR FAST LOADING SUBSTRATES IN A FLAT PANEL TOOL

(71) Applicant: Applied Materials, Inc., Santa Clara, CA (US)

(72) Inventors: Benjamin M. Johnston, Los Gatos, CA (US); Preston Fung, Daly City, CA (US); Sean Screws, San Jose, CA (US); Cheuk Ming Lee, Castro Valley, CA (US); Jae Myung Yoo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 81 days.

This patent is subject to a terminal disclaimer.

(21) Appl. No.: 17/157,634

(22) Filed: Jan. 25, 2021

(65) Prior Publication Data
US 2021/0149308 A1 May 20, 2021

Related U.S. Application Data

(63) Continuation of application No. 16/146,054, filed on Sep. 28, 2018, now Pat. No. 10,901,328.

(51) Int. Cl.
*G03F 7/00* (2006.01)

(52) U.S. Cl.
CPC .......... *G03F 7/7075* (2013.01); *G03F 7/707* (2013.01); *G03F 7/70716* (2013.01);
(Continued)

(58) Field of Classification Search
CPC .... G03F 7/7075; G03F 7/707; G03F 7/70716; G03F 7/70758; G03F 7/70775;
(Continued)

(56) References Cited

U.S. PATENT DOCUMENTS 4,775,281 A * 10/1988 Prentakis .......... H01L 21/67781
414/811
6,799,939 B2 10/2004 Lowrance et al.
(Continued)

FOREIGN PATENT DOCUMENTS

CN 1721933 A 1/2006
CN 1922087 A 2/2007
(Continued)

OTHER PUBLICATIONS

Chinese Office Action for Application No. 201980050092.5 dated May 5, 2023.
(Continued)

*Primary Examiner* — Ronald P Jarrett
(74) *Attorney, Agent, or Firm* — Patterson + Sheridan, LLP

(57) ABSTRACT

The present disclosure generally relates to a method and apparatus for loading, processing, and unloading substrates. A processing system comprises a load/unload system coupled to a photolithography system. The load/unload system comprises a first set of tracks having a first height and a first width, and a second set of tracks having a second height and a second width different than the first height and first width. An unprocessed substrate is transferred from a lift pin loader to a chuck along the first set of tracks on a first tray while a processed substrate is transferred from the chuck to the lift pin loader along the second set of tracks on a second tray. While a first tray remains with a substrate on the chuck during processing, the load/unload system is configured to unload a processed substrate and load an unprocessed substrate on a second tray.

20 Claims, 18 Drawing Sheets

(52) U.S. Cl.
CPC ...... *G03F 7/70758* (2013.01); *G03F 7/70775* (2013.01); *G03F 7/70791* (2013.01)

(58) Field of Classification Search
CPC .... G03F 7/70791; B25J 9/026; B21D 43/005; B65G 15/32; B65G 43/08; B65G 65/23
USPC .............. 414/797, 416.01; 310/12.01–12.15; 74/471 XY
See application file for complete search history.

(56) References Cited

U.S. PATENT DOCUMENTS

| | | | |
|---|---|---|---|
| 7,014,415 | B2 | 3/2006 | Yoshizawa |
| 7,375,946 | B2 | 5/2008 | White et al. |
| 8,444,364 | B2 | 5/2013 | Blonigan et al. |
| 9,287,152 | B2 | 3/2016 | Blonigan et al. |
| 2002/0034883 | A1 | 3/2002 | Klein et al. |
| 2009/0223697 | A1* | 9/2009 | Furuichi ........... H01L 21/67742 174/69 |
| 2010/0247763 | A1 | 9/2010 | Coutu et al. |
| 2011/0232569 | A1 | 9/2011 | Olgado |
| 2011/0312189 | A1 | 12/2011 | Kim et al. |
| 2011/0313565 | A1 | 12/2011 | Yoo et al. |
| 2014/0262979 | A1* | 9/2014 | Bonora ............. H01L 21/67271 209/577 |
| 2015/0063957 | A1 | 3/2015 | Olgado |
| 2016/0281236 | A1 | 9/2016 | Lemer et al. |

FOREIGN PATENT DOCUMENTS

| | | |
|---|---|---|
| CN | 102117732 A | 7/2011 |
| CN | 103119707 A | 5/2013 |
| JP | 2004101951 A | 4/2004 |
| JP | 2004273702 A | 9/2004 |
| JP | 2006171509 A | 6/2006 |
| JP | 2011014784 A | 1/2011 |
| JP | 2011233776 A | 11/2011 |
| JP | 2013512552 A | 4/2013 |
| KR | 20140062552 A | 5/2014 |
| KR | 20150135380 A | 12/2015 |
| TW | 201349377 A | 12/2013 |
| TW | 202029278 A | 8/2020 |

OTHER PUBLICATIONS

Taiwan Office Action for Application No. 110111854 dated Apr. 10, 2023.
Japan Office Action for Application No. 2022-104383 dated Sep. 5, 2023.
Taiwan Office Action for Application No. 110111854 dated Aug. 30, 2023.
Korean Office Action for Application No. (PCT) 10-2022-7045726 dated Aug. 25, 2023.
International Search Report and the Written Opinion for International Application No. PCT/US2019/037086 mailed Oct. 23, 2019.
Taiwanese Office Action and Search Report for TW Application No. 108123181 dated Jun. 18, 2020, 12 pages.

* cited by examiner

METHOD FOR FAST LOADING SUBSTRATES IN A FLAT PANEL TOOL

CROSS-REFERENCE TO RELATED APPLICATIONS

This application is a continuation of co-pending U.S. patent application Ser. No. 16/146,054, filed Sep. 28, 2018. The aforementioned related patent application is herein incorporated by reference.

BACKGROUND

Field

Embodiments of the present disclosure generally relate to apparatuses, systems and methods for processing one or more substrates, and more specifically to apparatuses, systems, and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices and quantities demanded by consumers, new apparatuses and approaches are needed to quickly, precisely, and cost-effectively process and create patterns on substrates, such as large area substrates.

SUMMARY

The present disclosure generally relates to a method and apparatus for loading, processing, and unloading substrates. A processing system comprises a load/unload system coupled to a photolithography system. The load/unload system comprises a first set of tracks having a first height and a first width, and a second set of tracks having a second height and a second width different than the first height and first width. An unprocessed substrate is transferred from a lift pin loader to a chuck along the first set of tracks on a first tray while a processed substrate is transferred from the chuck to the lift pin loader along the second set of tracks on a second tray. While a first tray remains with a substrate on the chuck during processing, the load/unload system is configured to unload a processed substrate and load an unprocessed substrate on a second tray.

In one embodiment, a processing system a base frame, a chuck coupled to the base frame, a pair of upper tray exchange modules disposed above the base frame, the pair of upper tray exchange modules being configured to move in a first direction and a second direction opposite the first direction a first distance to individually place one or more trays on the chuck, and a pair of lower tray exchange modules disposed between the base frame and the pair of upper tray exchange modules, the pair of lower tray exchange modules being configured to move in the first and second directions a second distance less than the first distance to individually lift the one or more trays off the chuck.

In another embodiment, a processing system comprises a lift pin loader, a chuck spaced from the lift pin loader, a pair of upper tray exchange modules configured to move in a first direction and a second direction opposite the first direction to transfer one or more trays from the lift pin loader to the chuck, and to move a first distance in a third direction perpendicular to the first direction and a fourth direction opposite the third direction, and a pair of lower tray exchange modules disposed parallel to the pair of upper tray exchange modules, the pair of lower tray exchange modules being configured to move in the first direction and the second direction to transfer the one or more trays from the chuck to the lift pin loader, and to move a second distance in the third direction and the fourth direction, wherein the first distance is greater than the second distance.

In yet another embodiment, a method of processing substrates comprises transferring a first tray along a first set of tracks in a first direction using a pair of upper tray exchange modules, transferring a second tray simultaneously along a second set of tracks in a second direction opposite the first direction using a pair of lower tray exchanges modules, moving the first tray in a third direction to place the first tray on a chuck using the pair of upper tray exchange modules, the third direction being perpendicular to the first direction, and moving the second tray simultaneously in the third direction to place the second tray on a lift pin loader using the pair of lower tray exchanges modules.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a method and apparatus for loading, processing, and unloading substrates. A processing system comprises a load/unload system coupled to a photolithography system. The load/unload system comprises a first set of tracks having a first height and a first width, and a second set of tracks having a second height and a second width different than the first height and first width. An unprocessed substrate is transferred from a lift pin loader to a chuck along the first set of tracks on a first tray while a processed substrate is transferred from the chuck to the lift pin loader along the second set of tracks on a second tray. While a first tray remains with a substrate on the chuck during processing, the load/unload system is configured to unload a processed substrate and load an unprocessed substrate on a second tray.

Figure 1A:
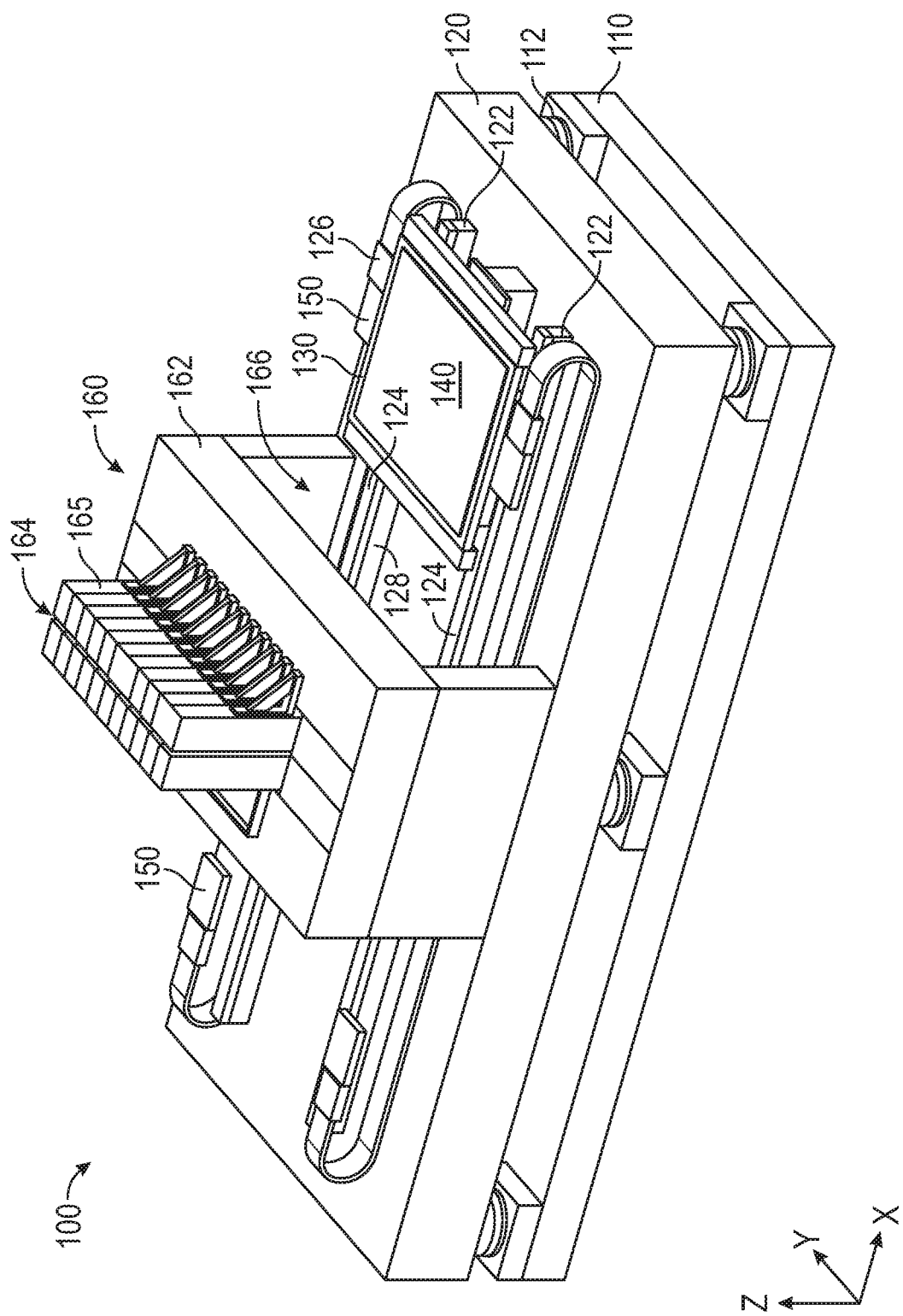
FIG. 1A is a perspective view of a photolithography system according to one embodiment.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example Alkaline Earth Boro-Aluminosilicate, used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly(methyl methacrylate), poly (methyl glutarimide), and SU-8. In this manner, the pattern is created on a surface of the substrate 140 to form the electronic circuitry.

The system 100 includes a pair of supports 122 and a pair of tracks 124. The pair of supports 122 is disposed on the slab 120, and, in one embodiment, the slab 120 and the pair of supports 122 are a single piece of material. The pair of tracks 124 is supported by the pair of the supports 122, and the stage 130 moves along the tracks 124 in the x-direction. In one embodiment, the pair of tracks 124 is a pair of parallel magnetic channels. As shown, each track 124 of the pair of tracks 124 is linear. In another embodiment, air bearings are utilized for high accurate non-contact motion, and linear motors are configured to provide the force to move the stage 130 back and forth in the x-direction and the y-direction. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 2). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the x-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or z-axis. The angular position measurement can be used to hold the angular position constant during scanning by means of a servo mechanism or it can be used to apply corrections to the positions of the patterns being written on the substrate 140 by the image projection apparatus 270, 271, shown in FIG. 2. These techniques may be used in combination.

Figure 1B:
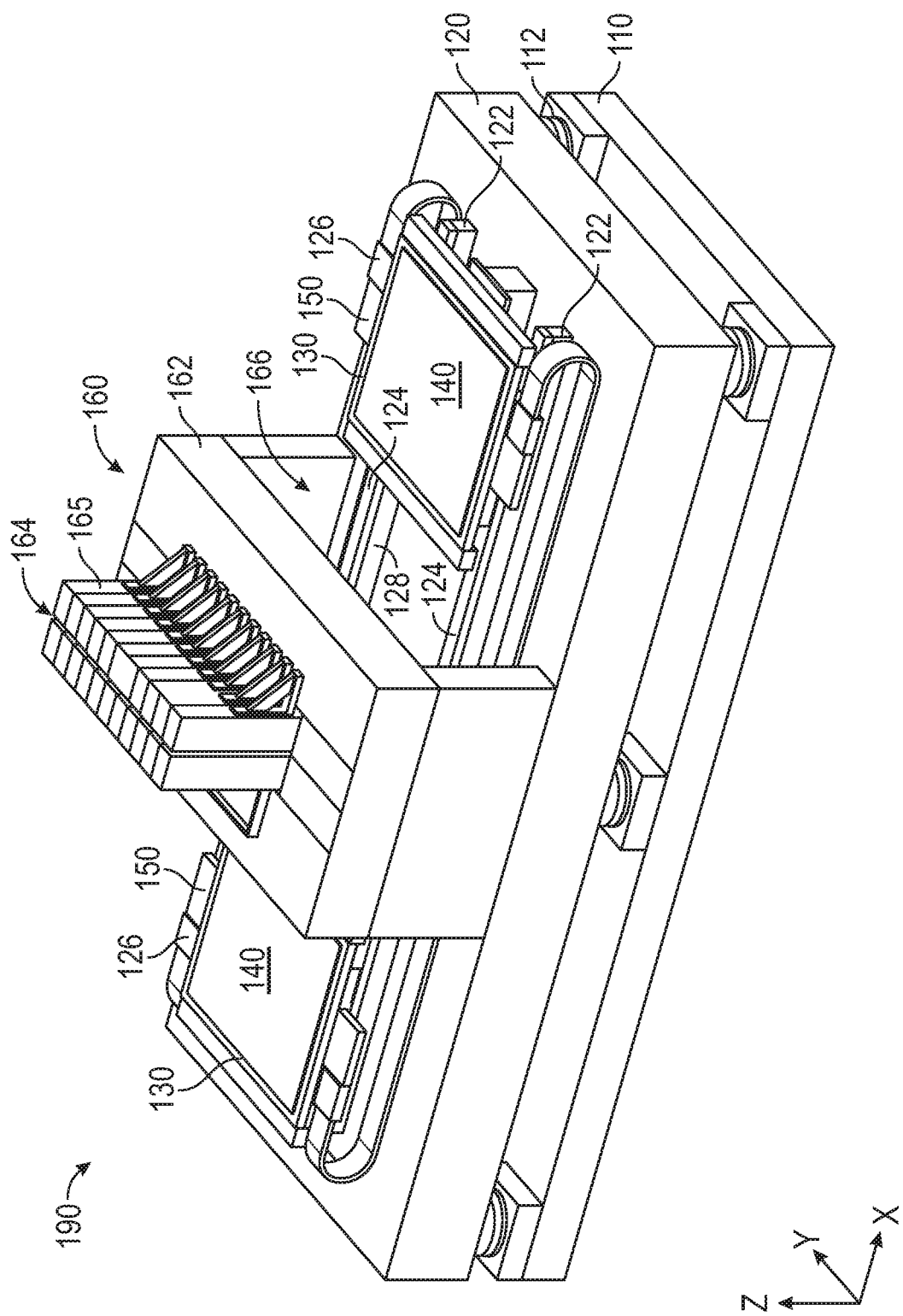
FIG. 1B is a perspective view of a photolithography system according to another embodiment.

FIG. 1B is a perspective view of a photolithography system 190 according to embodiments disclosed herein. The system 190 is similar to the system 100; however, the system 190 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2:
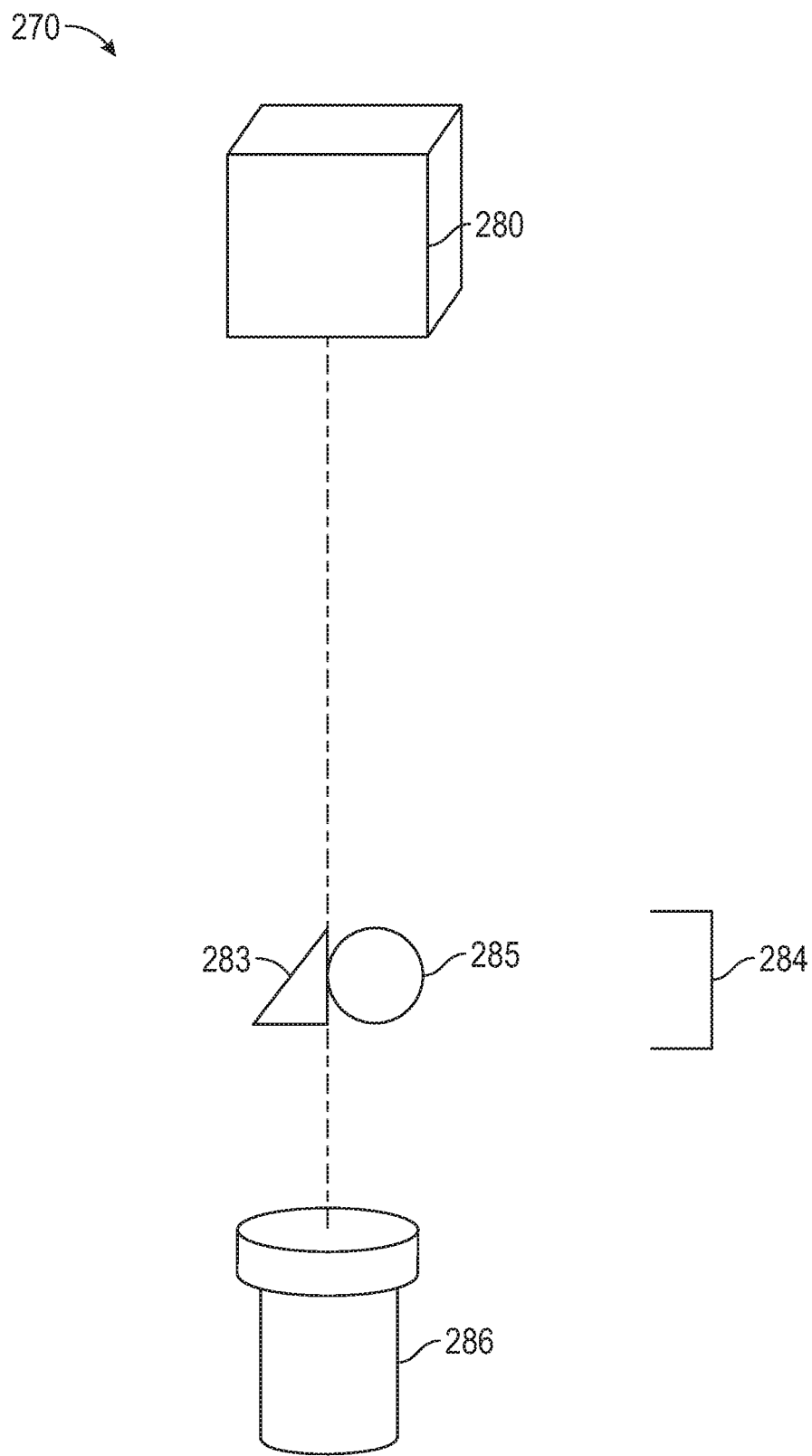
FIG. 2 is a perspective schematic view of an image projection apparatus according to embodiments disclosed herein.

FIG. 2 is a perspective schematic view of an image projection apparatus 270 according to one embodiment, which is useful for a photolithography system, such as system 100 or system 190. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs), liquid crystal displays (LCDs), and vertical-cavity surface-emitting lasers (VC-SELs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 190 is correct or within an predetermined tolerance. The projection optics 286, such as one or more lenses, is used to project the light onto the substrate, such as the substrate 140.

FIGS. 3A-3M illustrate various views of a processing system 300 loading, processing, and unloading multiple substrates, according to embodiments disclosed herein. While some components of the system 300 are described as moving in particular directions, the system 300 is not limited to functioning only in those directions, and may function in a reverse or opposite direction.

Figure 3A:
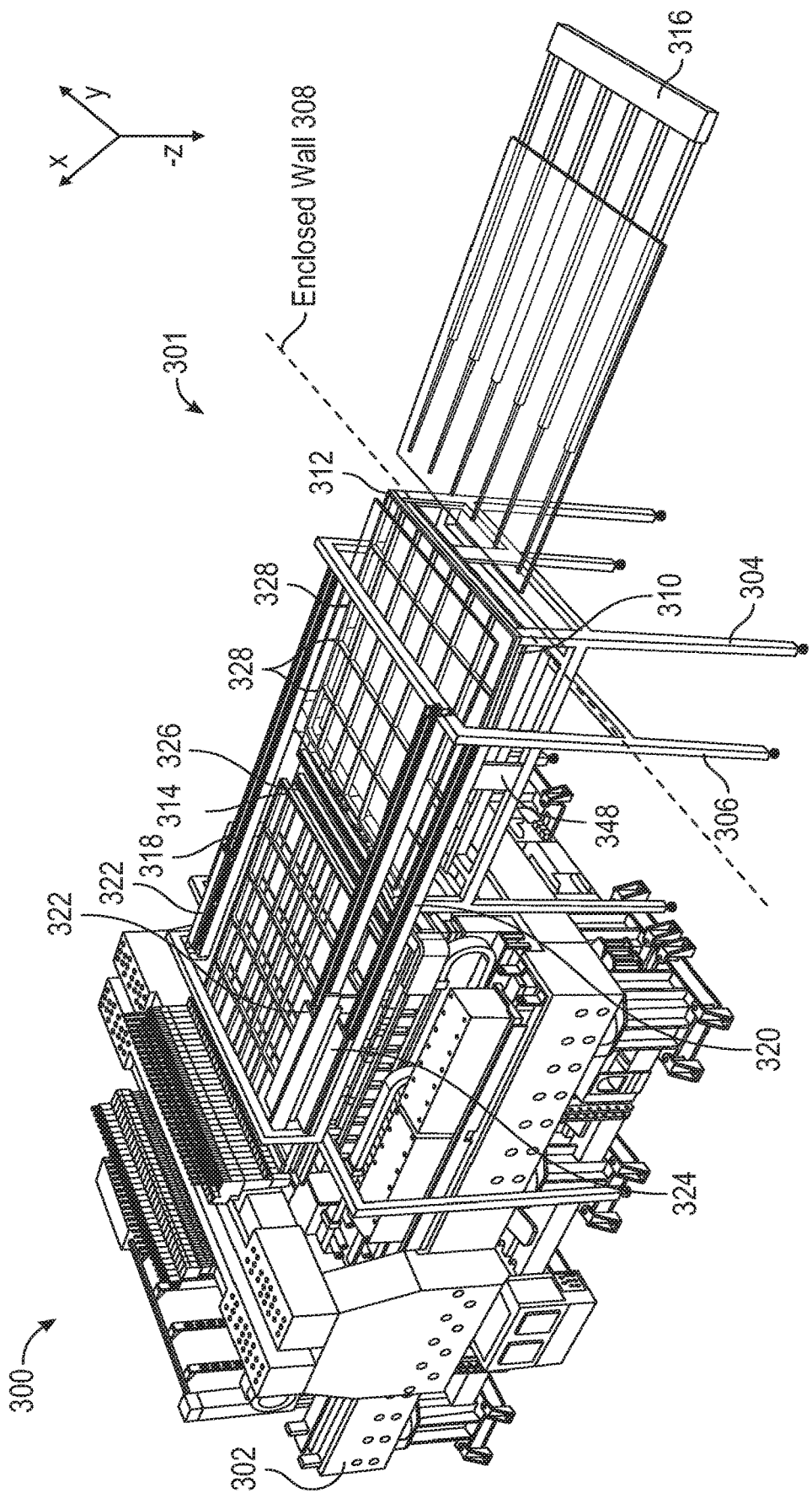
FIG. 3A illustrates an overview of a processing system for loading, processing, and unloading multiple substrates, according to one embodiment.

FIG. 3A illustrates an overview of a processing system 300, according to one embodiment. The processing system 300 comprises a photolithography system 302 coupled to a load/unload system 301. The photolithography system 302 may be the photolithography system 100 of FIG. 1A, or the photolithography system 190 of FIG. 1B. The load/unload system 301 and the photolithography system 302 are configured to work jointly together. The photolithography system 302 and the load/unload system 301 may be enclosed behind a wall, as illustrated by the dotted line 308. The load/unload system 301 comprises a lift pin loader (LPL) base frame 304 and a tray exchange module (TEM) base frame 306. The LPL base frame 304 is disposed adjacent to the photolithography system 302. The LPL base frame 304 comprises a plurality of mounts 348 configured to support trays. A portion of the TEM base frame 306 is disposed above a stage (not shown) of the photolithography system 302. The stage may be the stage 130 of FIGS. 1A-1B.

A lift pin loader (LPL) 310 is coupled to the LPL base frame 304 and comprises a plurality of lift pins 328. The LPL 310 is configured to move along the x-axis, the y-axis, and the z-axis, as well as in rotation about the z-axis as needed to position and lift substrates on a first tray 312 and a second tray 314. The first tray 312 and the second tray 314 may have a grid-like pattern such that the first tray 312 and the second tray 314 comprise a plurality of holes or openings. A robot arm 316 may transfer and extract substrates from the first tray 312 and the second tray 314. The robot arm 316 is configured to move along the x-axis and the z-axis. The plurality of lift pins 328 is configured to fit between the one or more holes or openings of the first tray 312 and the second tray 314.

The TEM base frame 306 comprises a first set or parallel tracks 318 and a second set of parallel tracks 320. The first set of parallel tracks 318 and the second set of parallel tracks 320 are both disposed along the x-axis and are parallel to one another. The first set of parallel tracks 318 and the second set of parallel tracks 320 extend above the stage (not shown) of the photolithography system 302. The first set of parallel tracks 318 is disposed at a greater height than the second set of parallel tracks 320. The second set of parallel tracks 320 have a greater width than the first set of parallel tracks 318. A pair of upper tray exchange modules (TEMs) 322 is disposed on the first set of parallel tracks 318, and a pair of lower TEMs 324 is disposed on the second set of parallel tracks 320. The pair of upper TEMs 322 is configured to move on the first set of parallel tracks 318 along the x-axis at a speed of about 2 meters per second. The pair of lower TEMs 324 is configured to move on the second set of parallel tracks 320 along the x-axis at a speed of about 2 meters per second. The pair of upper TEMs 322 and the pair of lower TEMs 324 are both configured to move along the x-axis, the y-axis, and the z-axis. The pair of upper TEMs 322 is configured to transfer the first tray 312 and the second tray 314 from the LPL 310 to a chuck 326. The pair of lower TEMs 324 is configured to transfer the first tray 312 and the second tray 314 from the chuck 326 to the LPL 310. The chuck 326 is disposed on the stage (not shown) of the photolithography system 302.

Figure 3B:
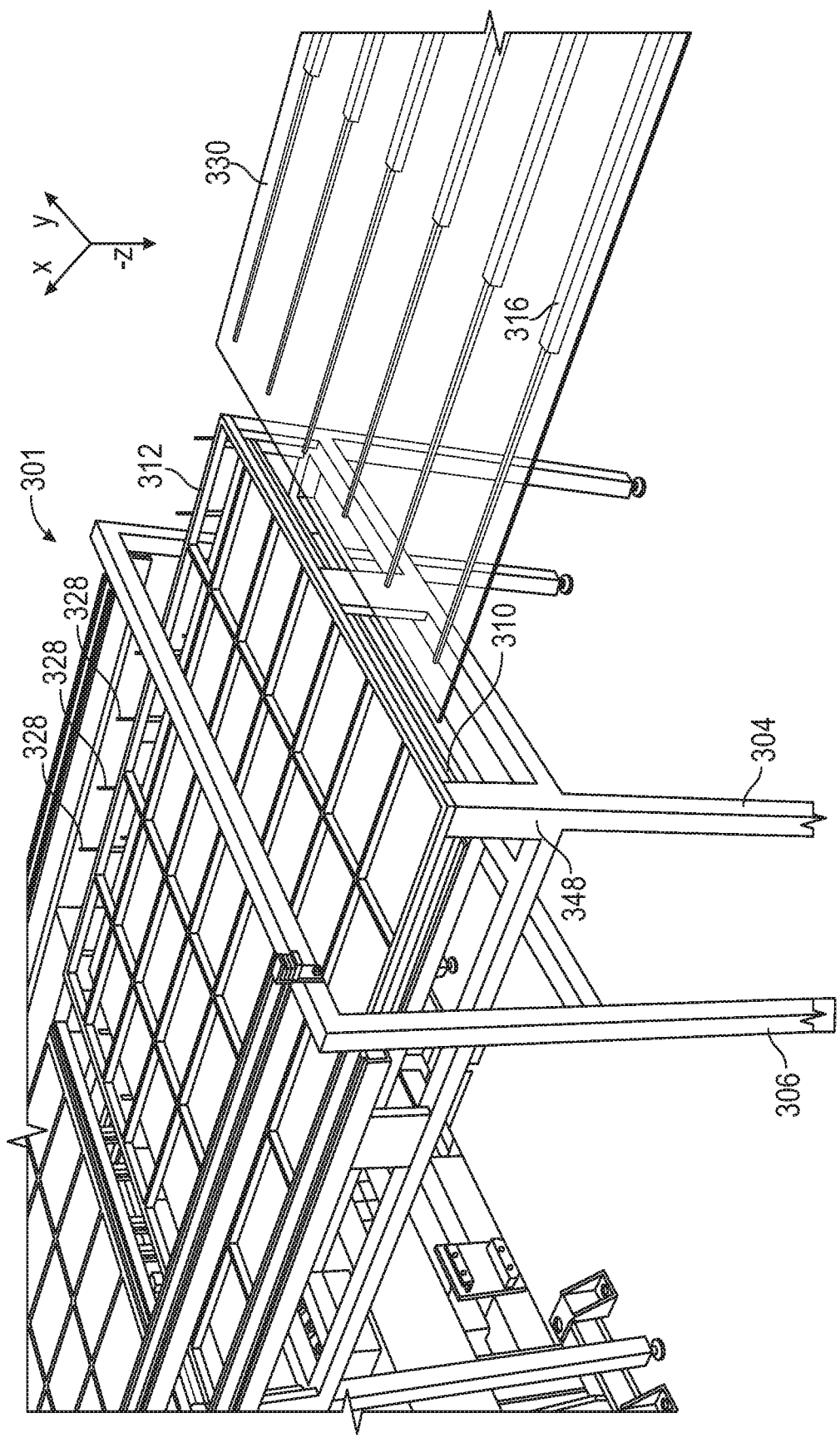
FIGS. 3B-3M illustrate various views of the processing system loading, processing, and unloading multiple substrates according to embodiments disclosed herein.
Figure 3C:
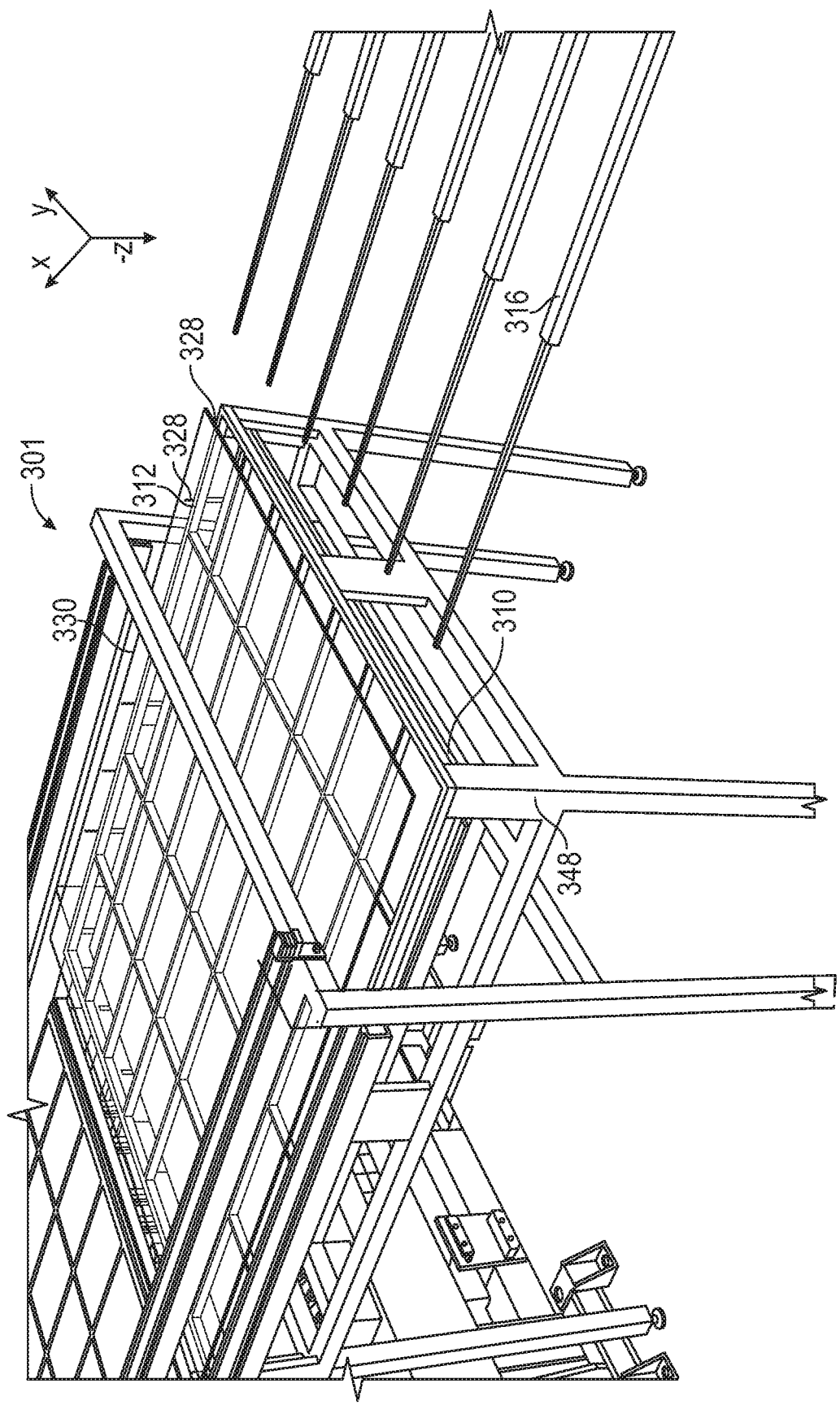

In FIGS. 3B and 3C, the robot arm 316 moves in the x-direction to place the first substrate 330 on to the plurality of lift pins 328 of the LPL 310. The robot arm 316 may further move in the −z-direction to place the first substrate 330 on to the of lift pins 328. The plurality of lift pins 328 are configured to fit between the one or more holes or openings of the first tray 312. The first tray 312 is disposed on the plurality of mounts 348 of the LPL base frame 304. The lift pins 328 support the first substrate 330 and temporarily space the first substrate 330 from the first tray 312. In one embodiment, the first substrate 330 is spaced from the first tray 312 by a distance of about 100 mm to 200 mm when supported by the lift pins 328. Once the robot arm 316 places the first substrate 330 on the lift pins 328, the robot arm 316 lowers in the −z-direction and retracts in the −x-direction, as shown in FIG. 3C. When the robot arm 316 lowers and retracts, the robot arm 316 is spaced from both the first substrate 330 and the first tray 312.

Figure 3D:
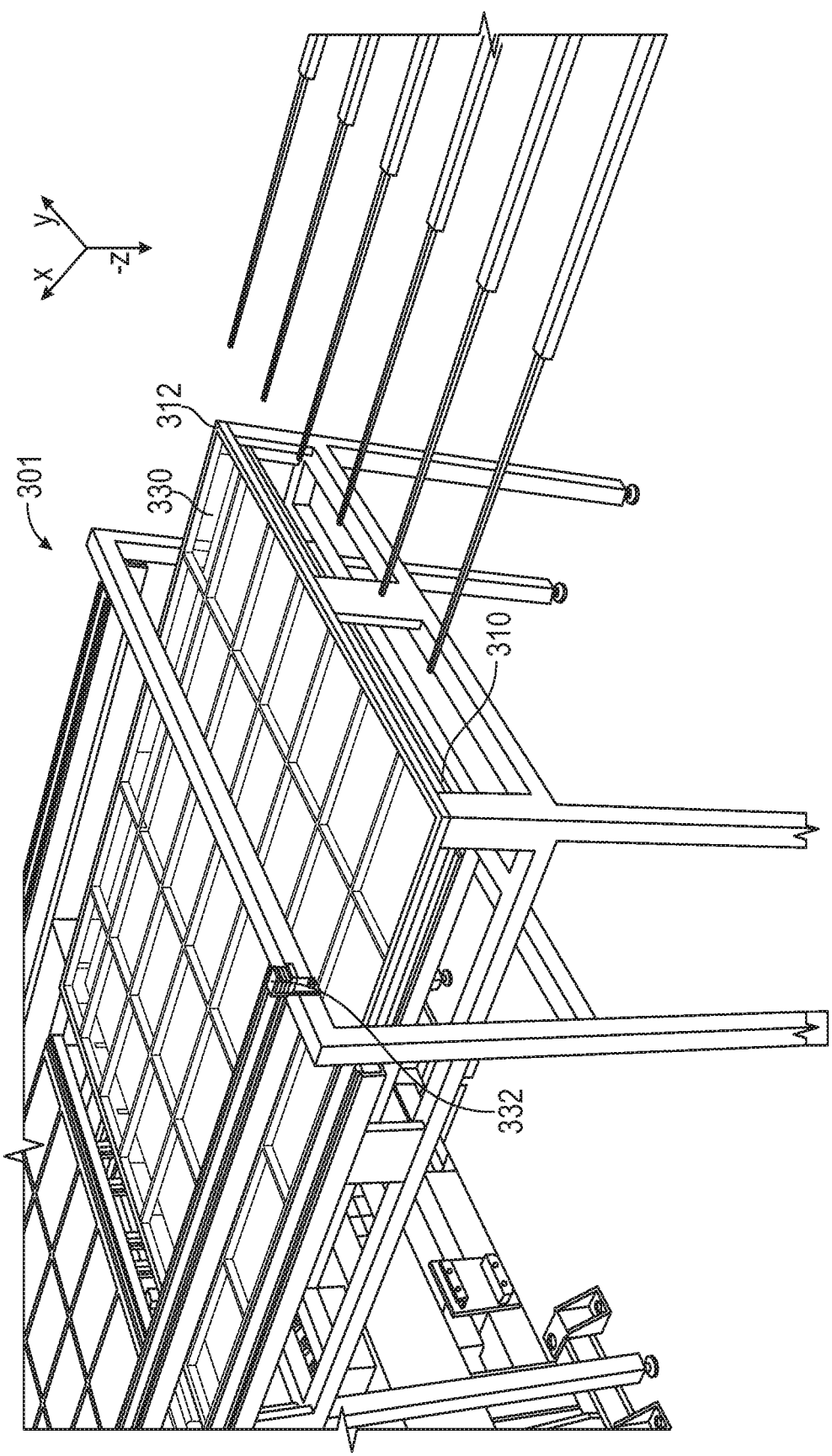

In FIG. 3D, the LPL 310 lowers in the −z-direction until the lift pins 328 are supporting the first substrate 330 above the first tray 312 by a distance of about 1 mm to 5 mm. A vision system 332 then positions the first substrate 330 on the first tray 312 by viewing the edges of the first substrate 330 and measuring the location of the first substrate 330. The vision system 332 is coupled to the TEM base frame 306, and may be communicatively coupled to the LPL 310. The vision system 332 determines the adjustments needed, and the LPL 310 adjusts the first substrate 330 as determined by the vision system 332 along the x-axis, the y-axis, and the z-axis to align with the first tray 312.

Figure 3E:
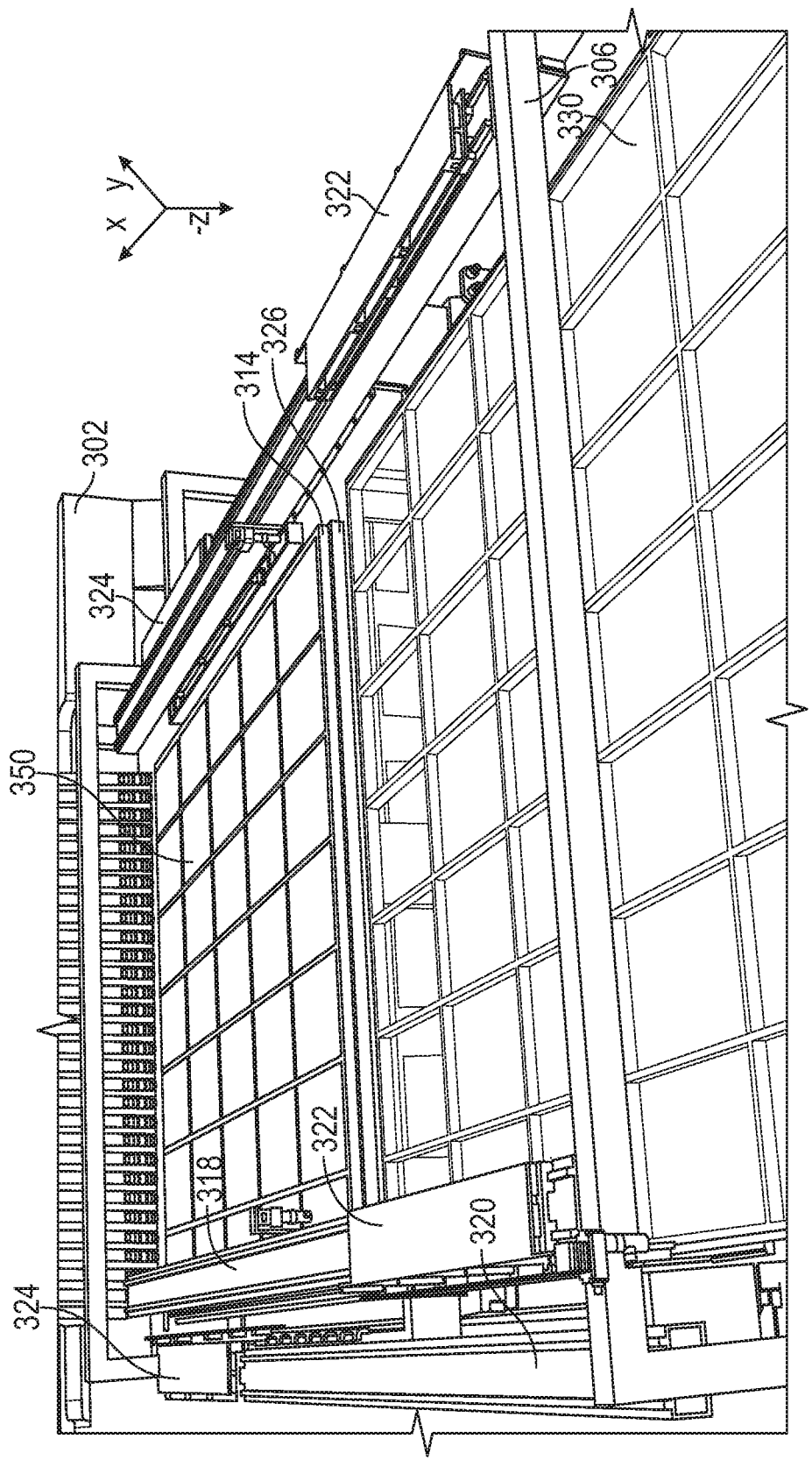

FIG. 3E illustrates the TEM base frame 306 comprising the pair of upper TEMs 322 disposed on the first set of parallel tracks 318 and the pair or lower TEMs 324 disposed on the second set of parallel tracks 320. The pair of upper TEMs 322 is configured to move on the first set of parallel tracks 318 along the x-axis, and the pair of lower TEMs 324 is configured to move on the second set of parallel tracks 320 along the x-axis. The pair of upper TEMs 322 may be configured to stop at a first location/end on the first set of parallel tracks 318 disposed above the LPL 310 and a second location/end on the first set of parallel tracks 318 disposed above the chuck 326. Similarly, the pair of lower TEMs 324 may be configured to stop at a first location/end on the second set of parallel tracks 320 disposed above the LPL 310 and a second location/end on the second set of parallel tracks 320 disposed above the chuck 326. As shown in FIG. 3E, the pair of upper TEMs 322 is disposed above the first substrate 330 at the first location while the pair of lower TEMs 324 is disposed above a second substrate 350 at the second location. The second substrate 350 is supported by the second tray 314 and may be disposed on the chuck 326.

Figure 3F:
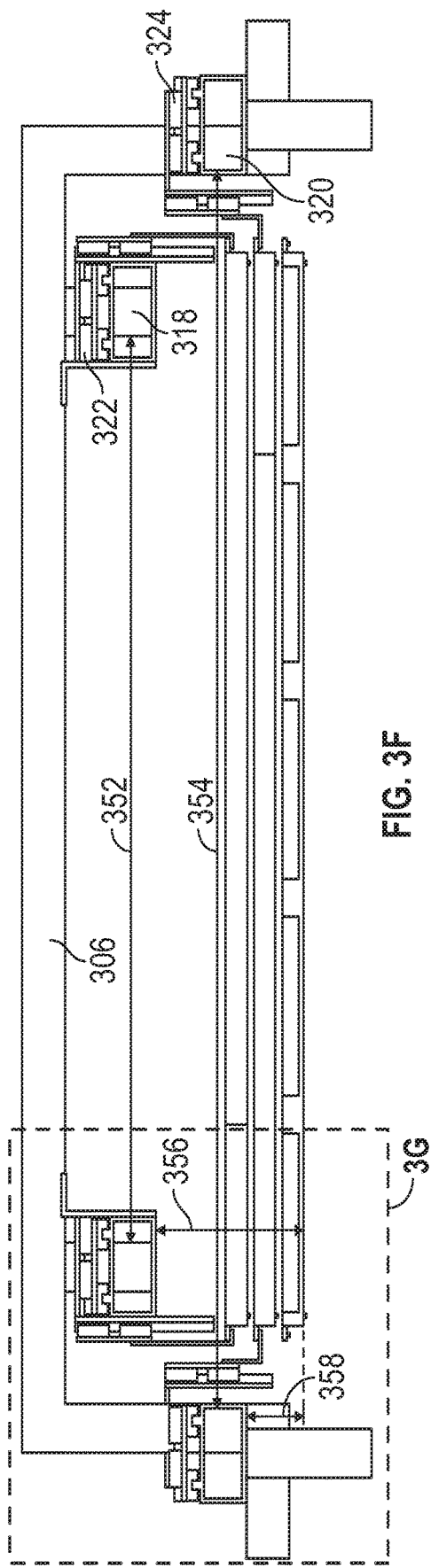
Figure 3G:
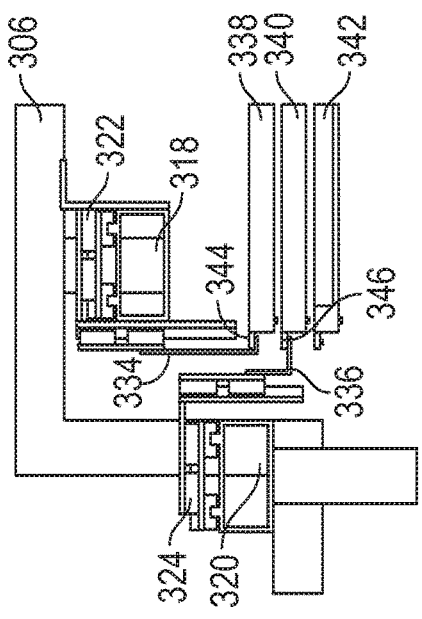

FIG. 3F illustrates a side view of the TEM base frame 306 while FIG. 3G illustrates a close up view of the boxed portion labeled FIG. 3G in FIG. 3F. As shown in FIG. 3F, the first set of parallel tracks 318 has a width 352 that is narrower than a width 354 of the second set of parallel tracks 320. The first set of parallel tracks 318 has a height 356 that is greater than a height 358 of the second set of parallel tracks 320. The first set of parallel tracks 318 having a different width and height than the second set of parallel tracks 320 enables the pair of upper TEMs 322 disposed on the first set of parallel tracks 318 and the pair of lower TEMs 324 disposed on the second set of parallel tracks 320 to simultaneously transfer substrates without colliding.

As shown in FIG. 3G, the pair of upper TEMs 322 comprises one or more effectors 334 that are configured to move from a first substrate transferring height 338 to a chuck/LPL height 342. The pair of lower TEMs 324 comprises one or more end effectors 336 that are configured to move from a second substrate transferring height 340 to the chuck/LPL height 342. The chuck/LPL height 342 is the height at which both the chuck 326 and the LPL 310 are disposed. The end effectors 334 of the pair of upper TEMs 322 are configured to move trays using interface tabs 344 from the first substrate transferring height 338 to the chuck/LPL height 342 along the z-axis. The end effectors 336 of the pair of lower TEMs 324 are configured to move trays using interface tabs 346 from the chuck/LPL height 342 to the second substrate transferring height 340 along the z-axis. To contact or release the interface tabs 344, 346 of trays, the end effectors 334 of the pair of upper TEMs 322 and the end effectors 336 of the pair of lower TEMs 324 are further configured to move along the y-axis.

The first set of parallel tracks 318 are disposed at the first substrate transferring height 338 while the second set of parallel tracks 320 are disposed at the second substrate transferring height 340. Thus, if the pair of upper TEMs 322 is transferring the first tray 312 to the chuck 326 while the pair of lower TEMs 324 is simultaneously transferring the second tray 314 to the LPL 310, the first tray 312 and the second tray 314 will be disposed at different heights, and will not contact or collide with one another. In one embodiment, the end effectors 336 of the pair of lower TEMs 324 may be configured to move only between the second substrate transferring height 340 and the chuck/LPL height 342, and may be unable to move to the first substrate transferring height 338. In another embodiment, the end effectors 334 of the pair of upper TEMs 322 may be restricted from stopping or operating at the second substrate transferring height 340.

Figure 3H:
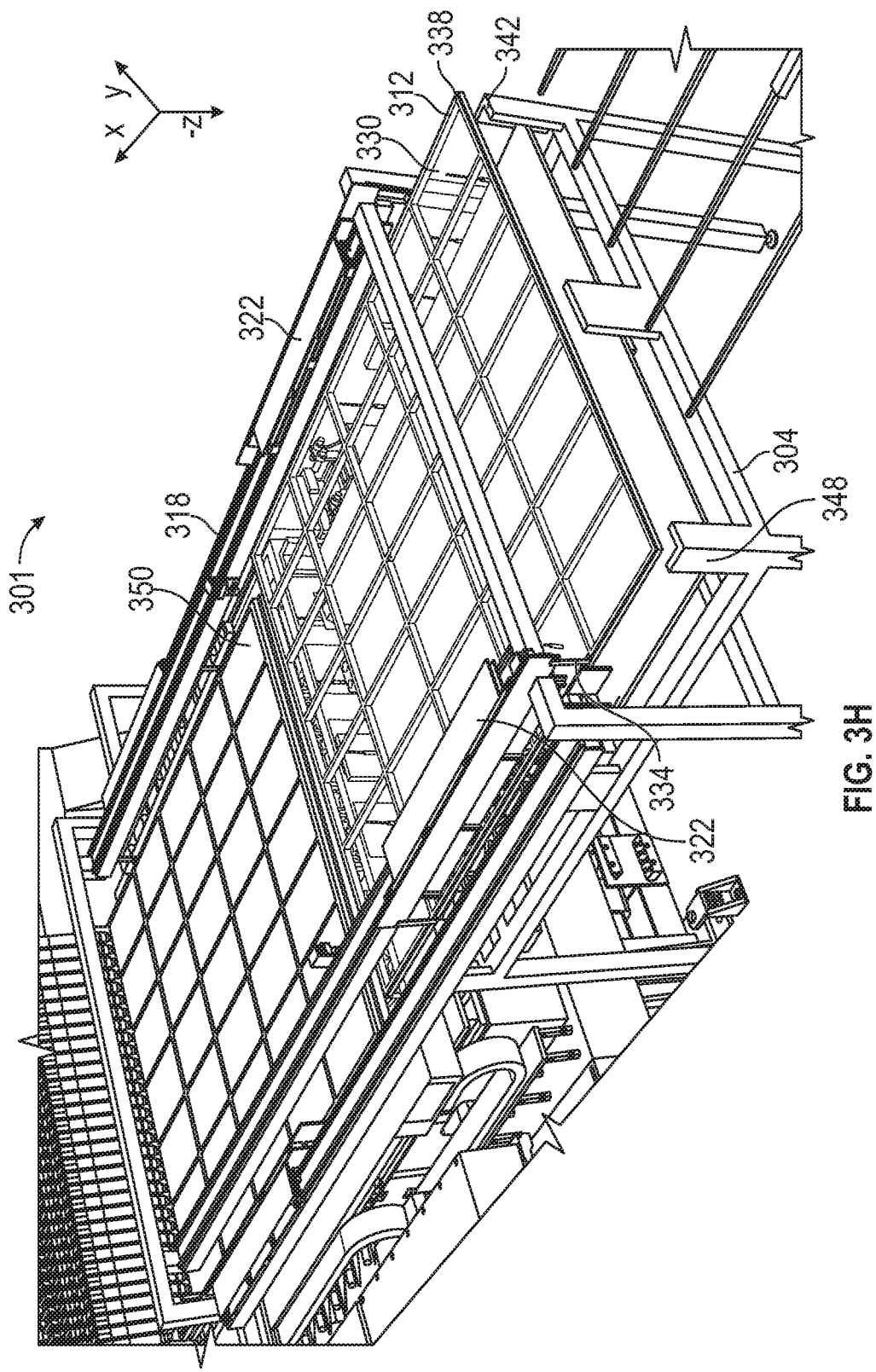

FIG. 3H illustrates the pair of upper TEMs 322 having moved along the first set of parallel tracks 318 in the −x-direction to pick up the first tray 312 supporting the first substrate 330 using the end effectors 334. Using the end effectors 334, the pair of upper TEMs 322 lifts the first tray 312 supporting the first substrate 330 off the plurality of mounts 348 of the LPL base frame 304 in the z-direction after the first substrate 330 has been positioned on the first tray 312. In other words, the pair of upper TEMs 322 lifts the first tray 312 supporting the first substrate 330 from the chuck/LPL height 342 to the first substrate transferring height 338. The end effectors 334 of the pair of upper TEMs 322 may lift the first tray 312 using the interface tabs 344.

Figure 3I:
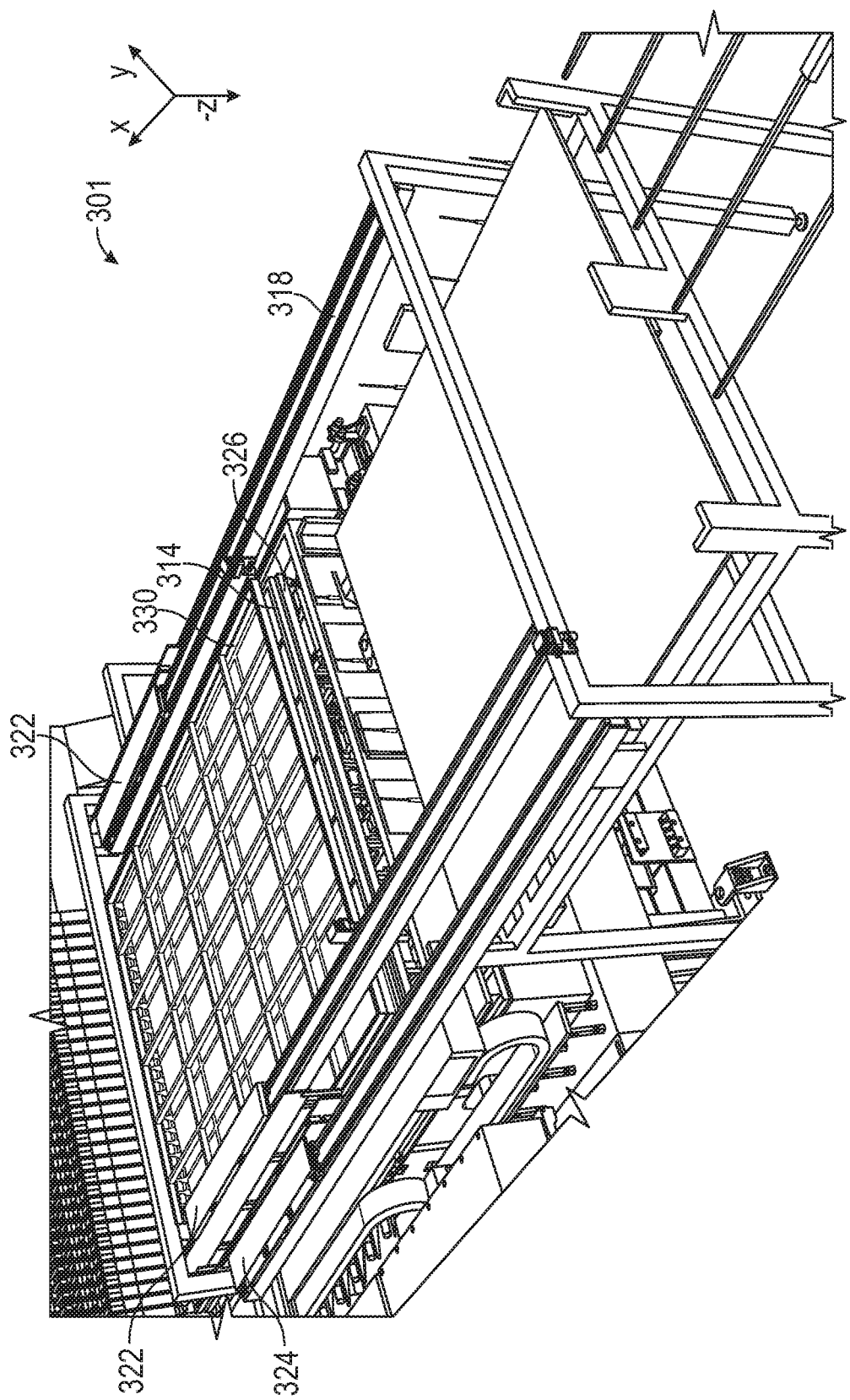

FIG. 3I illustrates the pair of upper TEMs 322 having moved along the first set of parallel tracks 318 in the x-direction to transfer the first tray 312 supporting the first substrate 330 using the end effectors 334. The pair of upper TEMs 322 transfers the first tray 312 and the first substrate 330 at the first substrate transferring height 338 to position the first tray 312 above the second tray 314 disposed on the chuck 326. Thus, when the chuck 326 is ready to receive the first tray 312 supporting the first substrate 330, the first tray 312 supporting the first substrate 330 are already in position to be loaded on to the chuck 326.

Figure 3J:
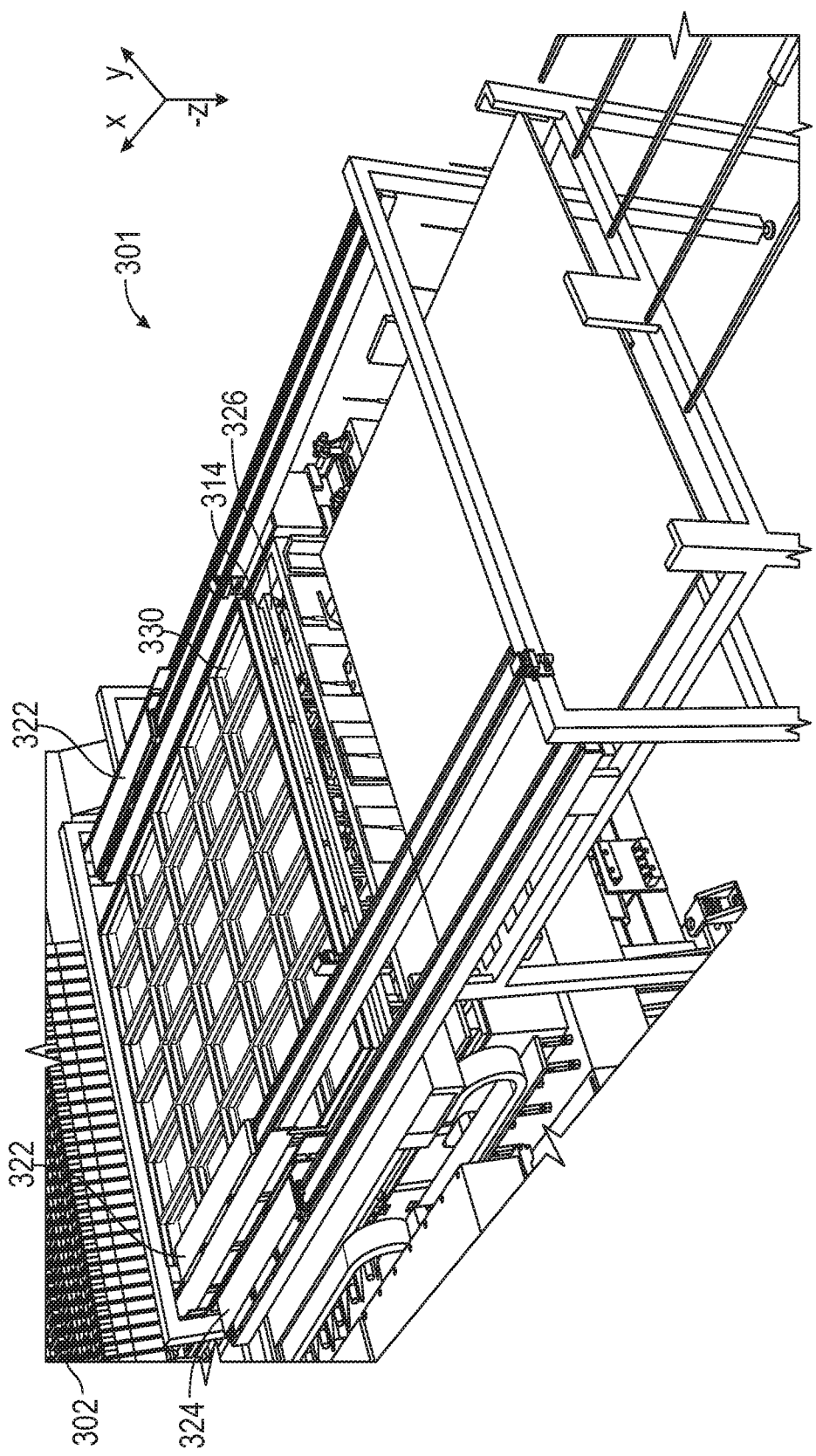

FIG. 3J illustrates the pair of lower TEMs 324 lifting the second tray 314 supporting the second substrate 350 from the chuck 326 after being processed. The end effectors 336 of the pair of lower TEMs 324 are configured to lift the second tray 314 supporting the second substrate 350 using the interface tabs 346 from the chuck/LPL height 342 to the second substrate transferring height 340 along the z-axis. Because the second substrate transferring height 340 is lower than the first substrate transferring height 338, the first tray 312 supporting the first substrate 330 may be disposed on top of the second tray 314 supporting the second substrate 350 without contacting the second tray 314 or the second substrate 350.

Figure 3K:
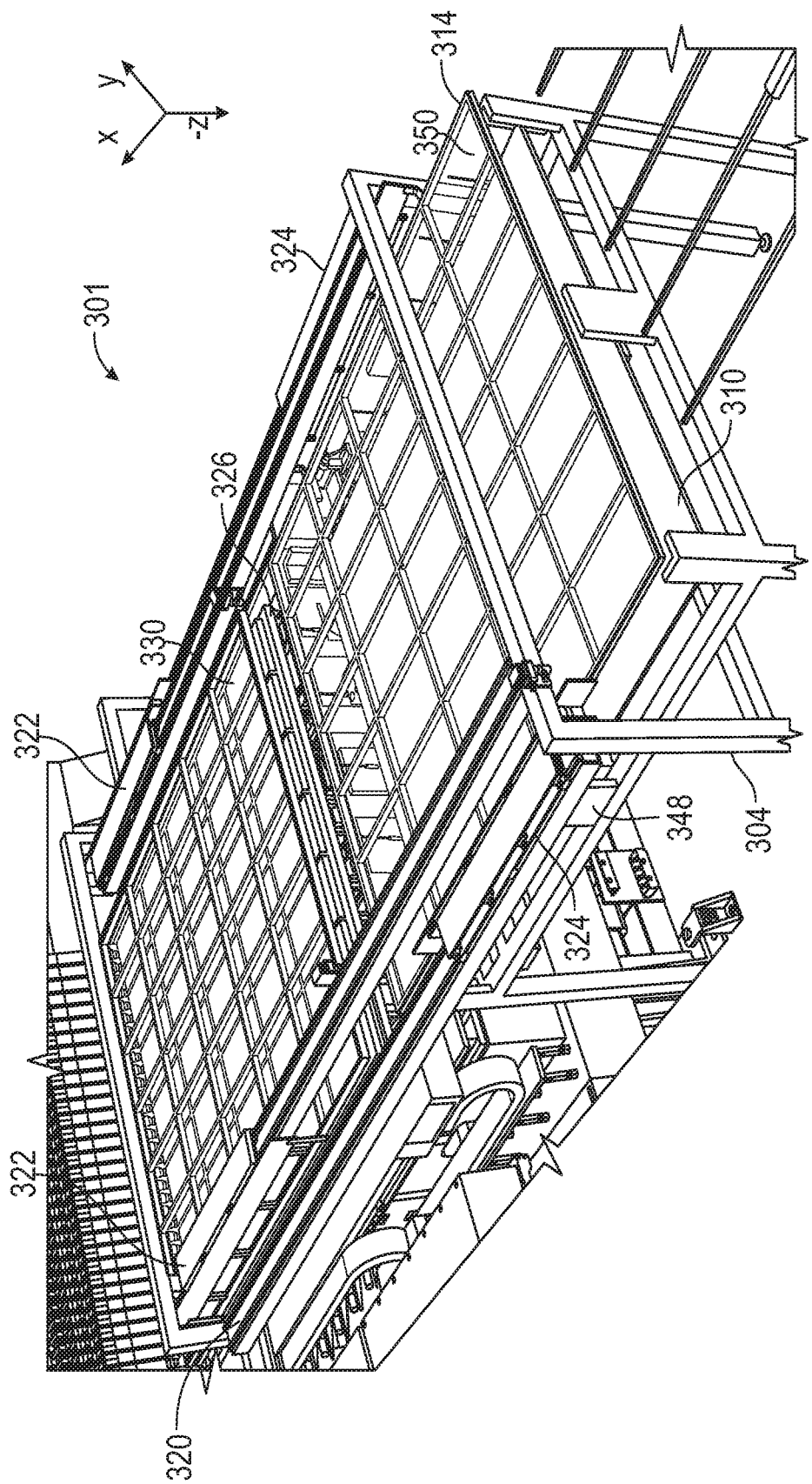

FIG. 3K illustrates the second tray 314 supporting the processed second substrate 350 having moved along the second set of parallel tracks 320 to be disposed above the plurality of mounts 348 of the LPL base frame 304. The first tray 312 supporting the first substrate 330 may be positioned for placement on the chuck 326. The pair of lower TEMs 324 moves the second tray 314 supporting the second substrate 350 along the second set of parallel tracks 320 in the −x-direction at the second substrate transferring height 340. Thus, the first tray 312 and the second tray 314 are transferred in a circular or cyclic manner through the system 300 using the pair of upper TEMs 322 and the pair of lower TEMs 324.

Figure 3L:
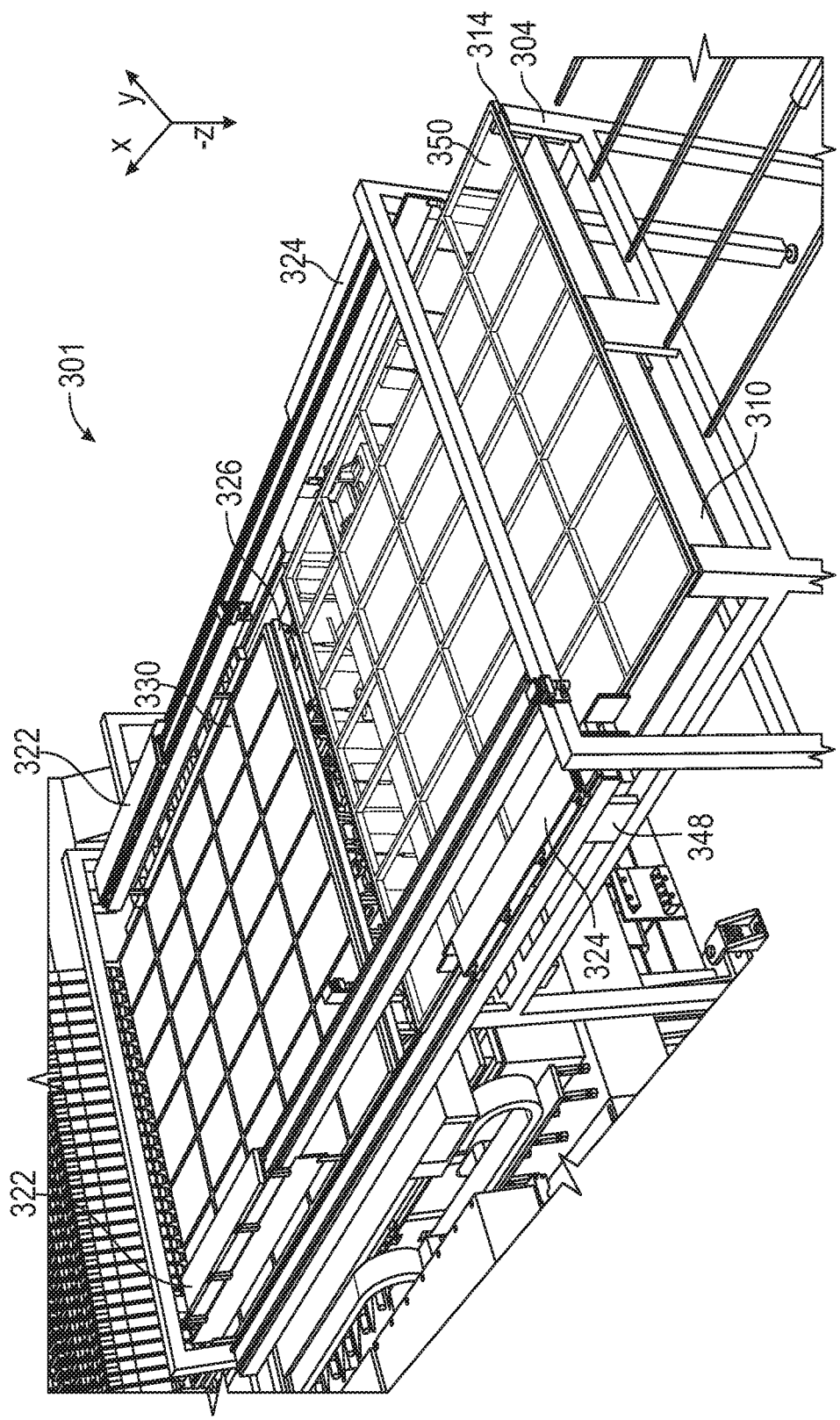

FIG. 3L illustrate the pair of lower TEMs 324 placing the second tray 314 supporting the second substrate 350 on the plurality of mounts 348 of the LPL base frame 304, and the pair of upper TEMs 322 placing the first tray 312 supporting the first substrate 330 on the chuck 326. Both the pair of lower TEMs 324 and the pair of upper TEMs 322 move in the −z-direction when placing the second tray 314 and the first tray 312, respectively.

Figure 3M:
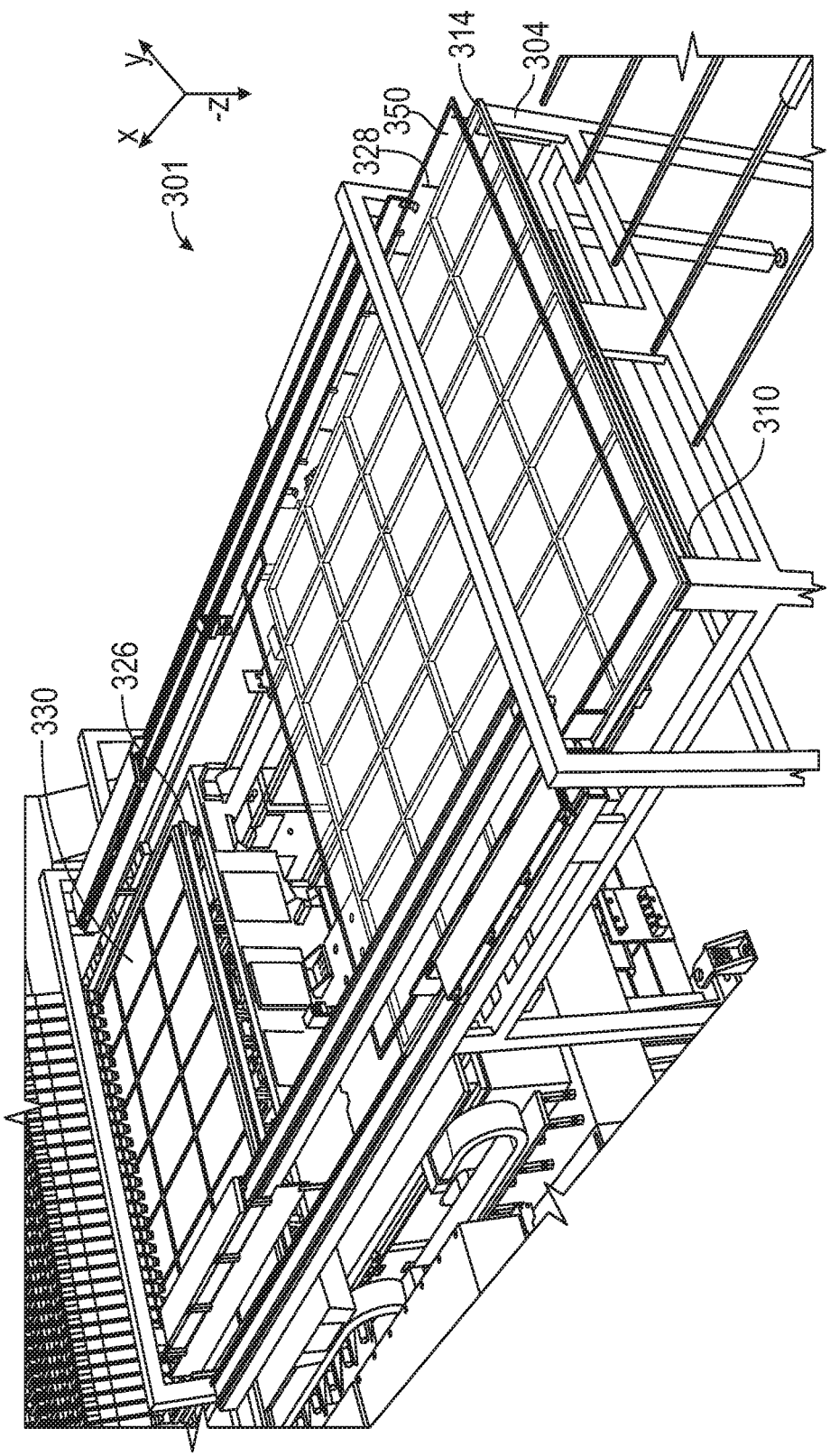

FIG. 3M illustrates the LPL 310 moving in the z-direction to enable the plurality of lift pins 328 to lift the second substrate 350 off the second tray 314, and the chuck 326 moving in the x-direction to transfer the first substrate 330 to the photolithography system 302 for processing. The plurality of lift pins 328 are configured to fit between the one or more holes or openings of the second tray 314. The robot arm 316 may then remove the second substrate 350 from the processing system 300. While the first substrate 330 is being processed, a third substrate (not shown) may be positioned on the lift pins 328 and placed on the second tray 314, as described above in FIGS. 3B-3D, to continuing processing substrates.

Thus, while first substrate 330 is being processed, the load/unload system 301 may unload a processed substrate and load an unprocessed substrate. For example, a third substrate (not shown) can be loaded onto the second tray 314 once the second substrate 350 is removed. The pair of upper TEMs 322 may then transfer the second tray 314 supporting the third substrate along the first set of parallel tracks 318 to be disposed above the chuck 326. Once the first substrate 330 is processed and removed from the chuck 326 via the pair of lower TEMs 324, the pair of upper TEMs 322 may place the second tray 314 supporting the third substrate on the chuck 326. By loading the third substrate onto the second tray 314 while the first substrate 330 is being processed, the amount of downtime between processing substrates can be reduced. Utilizing two trays 312, 314 reduces the time spent loading and unloading substrates, enabling a greater number of substrates to be processed by the processing system 300.

While some operations or aspects of FIGS. 3A-3M have been described or shown as happening simultaneously or concurrently, other timing and configurations are also contemplated herein. Moreover, while FIGS. 3A-3M are illustrated as being utilized with a single stage processing system, a dual stage processing system may be used as well. With a dual stage processing system, such as shown in FIG. 1B, a load/unload system 301 may be coupled to each processing stage.

Figure 4A:
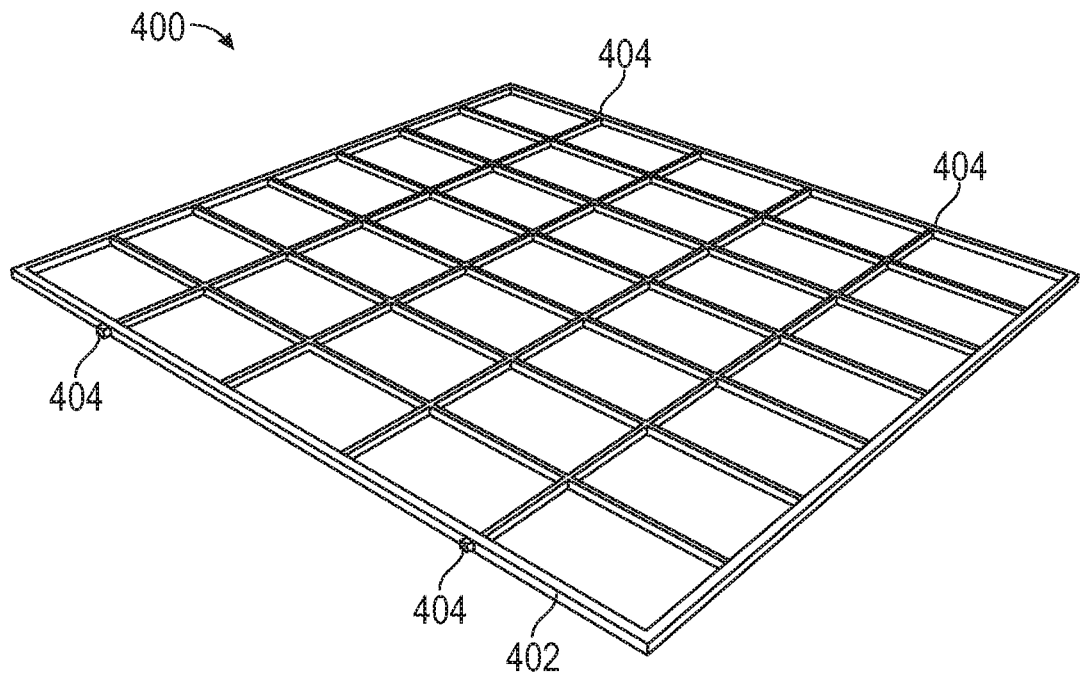
FIGS. 4A-4B illustrate a tray used in a processing system, according to one embodiment.
Figure 4B:
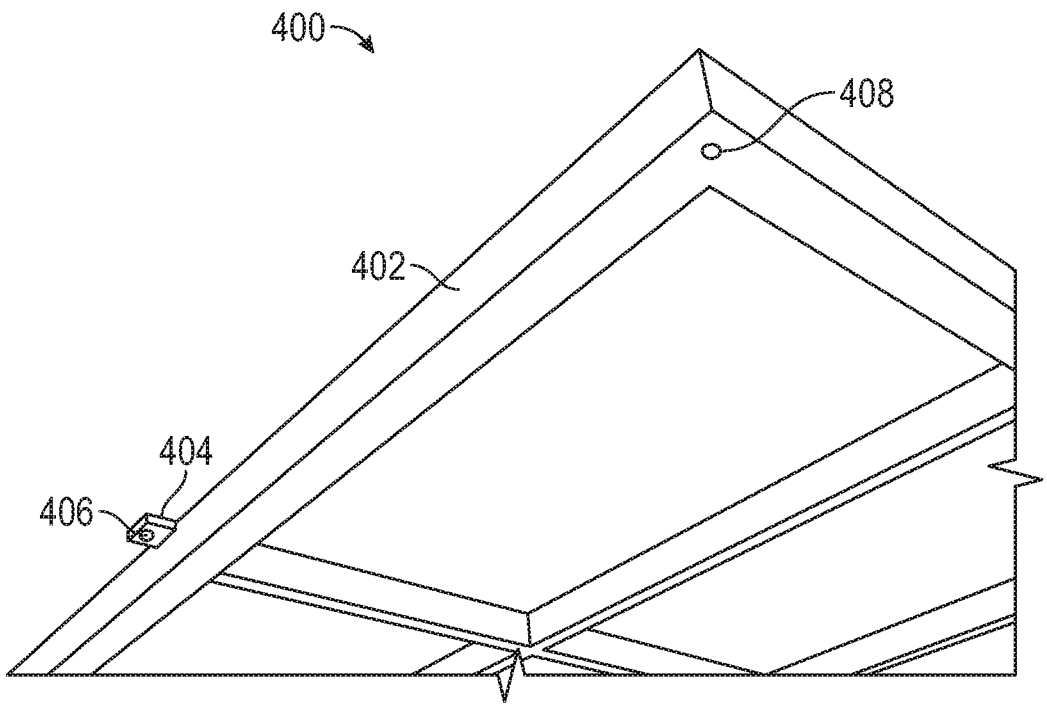
Figure 4C:
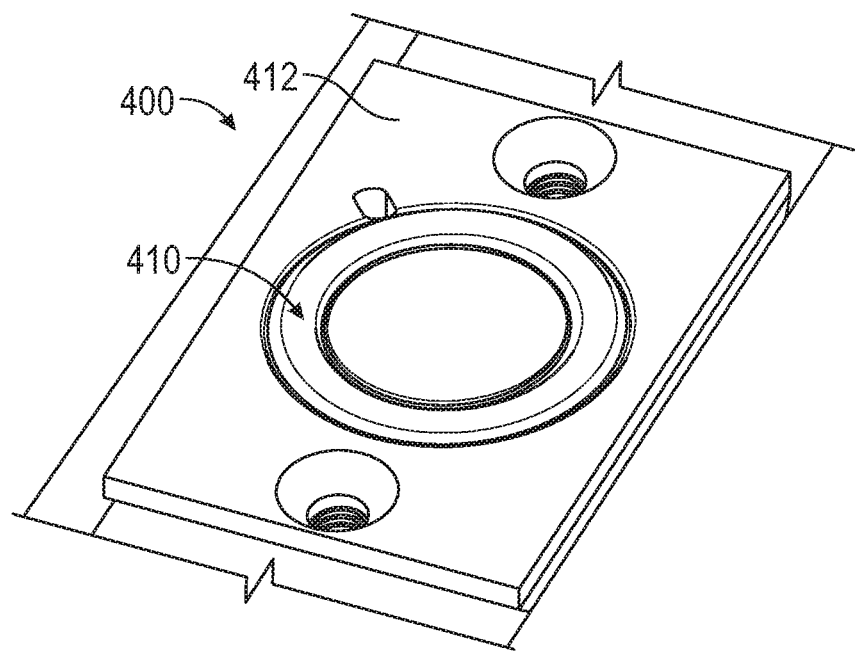
FIG. 4C illustrates one or more circular rings disposed on the topside of a tray, according to one embodiment.

FIGS. 4A-4C illustrate a tray 400 used in a processing system, such as processing system 300 of FIGS. 3A-3M, according to one embodiment. A processing system may comprise one or more trays 400. For example, the tray 400 may be both the first tray 312 and the second tray 314 of FIGS. 3A-3M.

FIG. 4A illustrate the tray 400 having a plurality of interface tabs 404 disposed on the tray perimeter 402, according to one embodiment. The tray 400 has a grid-like pattern such that the tray 400 has a plurality of holes or openings. The interface tabs 404 may be the interface tabs 344 and 346 of FIGS. 3A-3M. As shown in FIG. 4A, the tray perimeter 402 has interface tabs 404 on at least two parallel or opposite sides of the tray 400. Having interface tabs 404 on at least two parallel sides of the tray 400 enables a pair of upper TEMs and a pair of lower TEMs to contact the interface tabs 404 to lift, transfer, and release the tray 400. Further, the tray 400 is shown as having four interface tabs 404, with two tabs disposed on two parallel sides of the tray 400; however, the tray 400 may include any number of interface tabs 404 and is not limited to four. Additionally, all four sides of the tray 400 may include one or more interface tabs 404.

FIG. 4B illustrates the underside of the tray 400 having a plurality of tooling balls 406, 408, according to one embodiment. Each interface tab 404 disposed on the tray perimeter 402 may include a tooling ball 406 on the underside (i.e. the side of the interface tab 404 opposite a substrate). The tooling ball 406 is coupled to a kinematic mount on the end effectors of both the pair of upper TEMs and the pair of lower TEMs. The tray 400 further includes one or more tooling balls 408 disposed on the tray perimeter 402. For example, each corner of the tray 400 may include a tooling ball 408. The tooling ball 408 is coupled to a kinematic mount on the chuck and LPL base frame. The tooling balls 406 disposed on the interface tabs 404 and the tooling balls 408 disposed on the tray perimeter 402 may be the same.

FIG. 4C illustrates a close up of one or more circular rings 410 disposed on the topside of the tray 400, according to one embodiment. The one or more circular rings 410, such as o-rings, may be coupled to the tray 400 via ring mounts 412 and may be disposed at various intervals on the topside of the tray 400 (i.e. the side of the tray 400 supporting a substrate). The one or more circular rings 410 may be comprised of silicone. The one or more circular rings 410 are disposed slightly above the surface of the ring mount 412 by about 0.1 mm to 1 mm. When a substrate is placed on the tray 400, the substrate contacts the one or more circular rings 410 without contacting the tray 400. The one or more circular rings 410 coupled with the relatively fast tray transferring speed (about 2 meters per second) enables the substrate to be effectively held to the tray 400 by friction. By utilizing friction to hold and secure the substrate to the circular rings 410 of the tray 400, load and unload times can be reduced, as no clamps or fasteners are used to secure the substrates.

Figure 5:
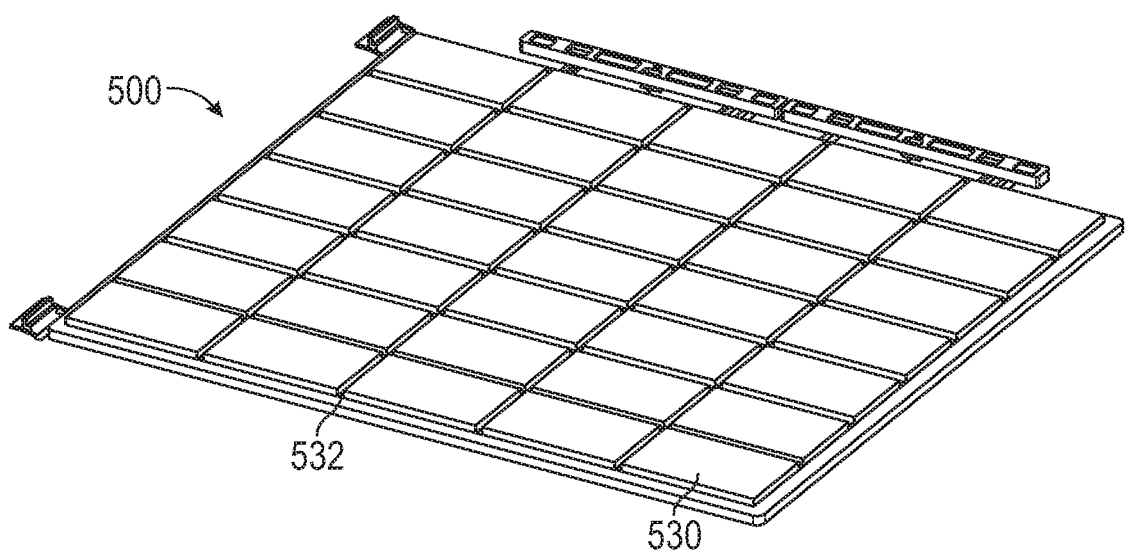
FIG. 5 illustrates a chuck, according to one embodiment.

FIG. 5 illustrates a chuck 500, according to one embodiment. The chuck 500 may be the chuck 326 of FIGS. 3A-3M, and may be disposed on a stage of a photolithography system. The chuck 500 comprises substrate supporting surface 530 and a tray grid 532. When a tray transferring a substrate is placed on the chuck 500, the tray is first aligned with the tray grid 532 and then placed within the tray grid 532 such that the tray is disposed below the substrate supporting surface 530. The tray is disposed below the substrate supporting surface 530 by a distance of about 0.5 mm to 4 mm. The tray grid 532 has the same pattern or shape as the trays such that the tray fits entirely within the tray grid 532. For example, the tray grid 532 of the chuck 500 matches the grid-pattern of the tray 400 of FIG. 4A. Thus, the tray being entirely disposed within the tray grid 532 allows the substrate supporting surface 530 of the chuck 500 to entirely support the substrate for processing.

Figure 6:
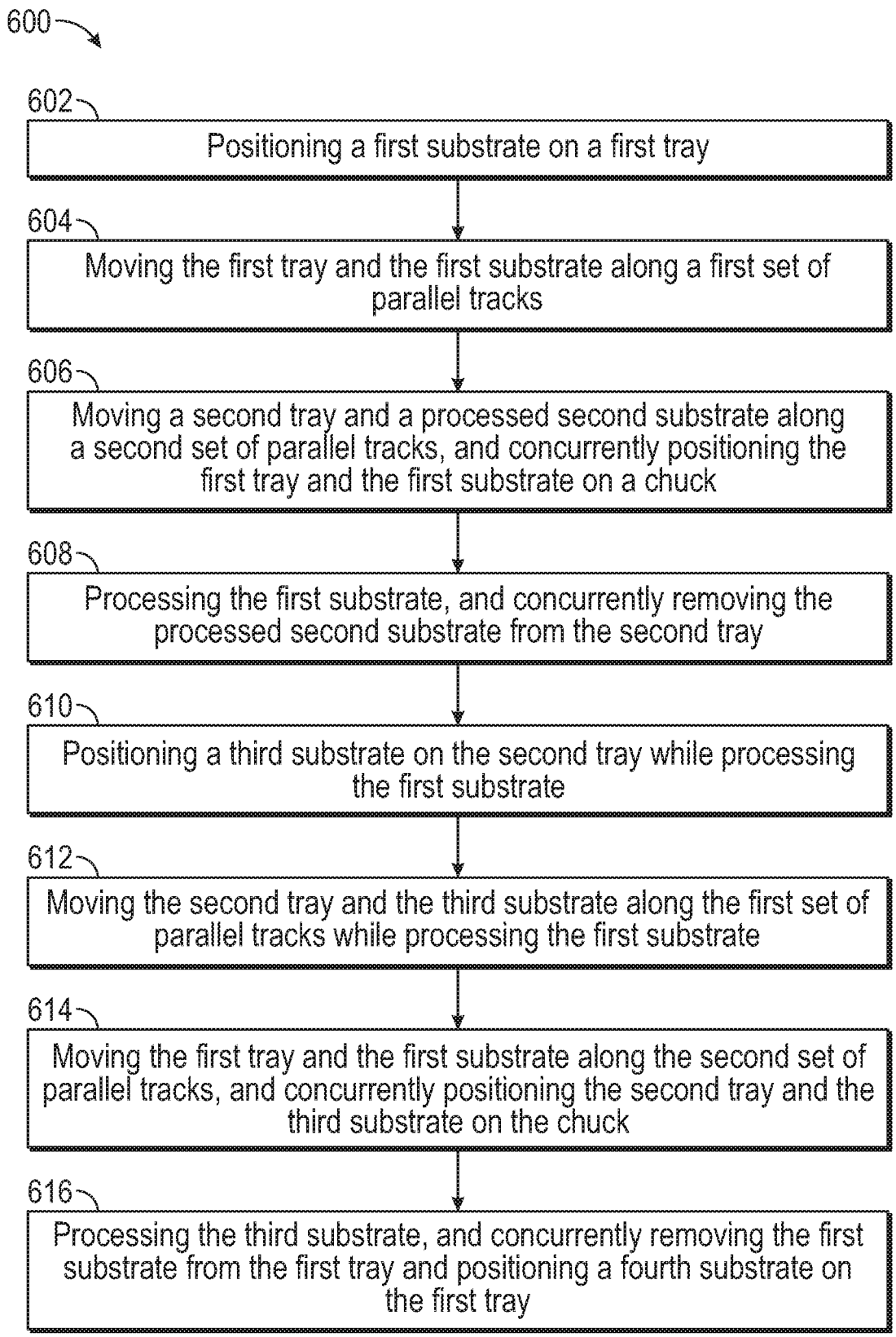
FIG. 6 illustrates a method of loading, processing, and unloading multiple substrates in a processing system utilizing a load/unload system, according to one embodiment.

FIG. 6 illustrates a method 600 of loading, processing, and unloading multiple substrates in a processing system utilizing a load/unload system, such as the processing system 300 and the load/unload system 301 of FIGS. 3A-3M. Some operations of method 600 have been described in detail above with respect to FIGS. 3A-3M, and as such, are not repeated in detail below.

Method 600 begins in operation 602, with a first substrate being positioned on a first tray, as shown and described above in FIGS. 3B-3D. Positioning the first substrate on the first tray may include placing the first substrate on the plurality of lift pins of the LPL using a robot arm, using a vision system to ensure accurate alignment of the first substrate to the first tray, and moving the LPL to place the first substrate on the first tray.

Once the first substrate is properly positioned on the first tray, the method 600 proceeds to operation 604. In operation 604, the first tray and the first substrate are moved along the first set of parallel tracks to be disposed above a chuck using a pair of upper TEMs, as shown and described above in FIGS. 3E-3I. Moving the first tray supporting the first substrate along the first set of parallel tracks may include utilizing end effectors of the pair of upper TEMs to contact interface tabs of the first tray, and moving the first tray supporting the first substrate via the interface tabs at the first substrate transferring height. The first tray may be moved along the pair of upper TEMs at a speed of around 2 meters per second.

In operation 606, a second tray supporting a processed second substrate is moved along the second set of parallel tracks to be disposed over the LPL, and concurrently, the first tray supporting the first substrate is positioned on the chuck, as shown and described above in FIGS. 3J-3K. Moving the second tray supporting the processed second substrate may include using the end effectors of the pair of lower TEMs to lift the second tray off the chuck via the interface tabs of the tray, and using the pair of lower TEMs to transfer the second tray supporting the processed second substrate along the second set of parallel tracks at the second substrate transferring height until the second tray is disposed over the LPL. Positioning the first tray supporting the first substrate on the chuck may include using the end effectors of the pair of upper TEMs to lower the first tray and first substrate on to the chuck. The second tray may be moved along the pair of lower TEMs at a speed of around 2 meters per second.

In operation 608, the first substrate is processed, and concurrently, the processed second substrate is removed from the second tray using the LPL, as shown and described above in FIGS. 3L-3M. Processing the first substrate may include transferring the chuck supporting the first substrate to the photolithography system. Removing the processed second substrate from the second tray may include using the end effectors of the pair of lower TEMs to place the second tray on the plurality of mounts of the LPL base frame, moving the LPL such that the plurality of lift pins lift the second substrate from the second tray, and using the robot arm to remove the processed second substrate from the lift pins.

In operation 610, a third substrate is positioned on the second tray while the first substrate is being processed. Positioning the third substrate on the second tray may include placing the third substrate on the plurality of lift pins of the LPL using a robot arm, using a vision system to ensure accurate alignment of the third substrate to the second tray, and moving the LPL to place the third substrate on the second tray, similar to operation 602 and as shown and described above in FIGS. 3B-3D.

In operation 612, the second tray and the third substrate are moved along the first set of parallel tracks while the first substrate is being processed. Moving the second tray supporting the third substrate along the first set of parallel tracks may include utilizing the end effectors of the pair of upper TEMs to contact interface tabs of the second tray, and moving the second tray supporting the third substrate via the interface tabs at the first substrate transferring height, similar to operation 604 and as shown and described above in FIGS. 3E-3I.

In operation 614, the first tray and the first substrate are moved along the second set of parallel tracks, and concurrently, the second tray and the third substrate are positioned on the chuck. Moving the first tray supporting the processed first substrate may include using the end effectors of the pair of lower TEMs to lift the first tray off the chuck via the interface tabs of the first tray, and using the pair of lower TEMs to transfer the first tray supporting the processed first substrate along the second set of parallel tracks at the second substrate transferring height until the second tray is disposed over the LPL, similar to operation 606. Positioning the second tray supporting the third substrate on the chuck may include using the end effectors of the pair of upper TEMs to lower the second tray and third substrate on to the chuck, similar to operation 606.

In operation 616, the third substrate is processed, and concurrently, the first substrate is removed from the first tray and a fourth substrate is positioned on the first tray. Processing the third substrate may include transferring the chuck supporting the second substrate to the digital lithography tool, similar to operation 608. Removing the processed first substrate from the first tray may include using the end effectors of the pair of lower TEMs to place the first tray and first substrate on the LPL base frame, moving the LPL such that the plurality of lift pins lift the first substrate from the first tray, and using the robot arm to remove the processed second substrate from the lift pins, similar to operation 608.

Method 600 may be repeated one or more times, with the first tray and the second tray each transferring processed and unprocessed substrates through the system. As an unprocessed substrate supported by the first tray is being processed, a first processed substrate is being removed from the second tray, and a second unprocessed substrate is loaded onto the second tray. The second tray is then moved to be positioned above the chuck, and the first tray supporting the newly processed substrate is moved to be positioned above the LPL. The second unprocessed substrate supported by the second tray is then processed as the newly processed substrate is removed from the first tray. A third unprocessed substrate is then loaded onto the first tray while the second unprocessed substrate supported by the second tray is processed. Method 600 repeats one or more times to continuously load and unload substrates while simultaneously processing a substrate. Additionally, while some operations of method 600 have been described as occurring simultaneously or concurrently, other timing and configurations are also contemplated herein.

Utilizing method 600 with the processing system 300 enables substrates to be loaded, processed, and unloaded in a more efficient and quicker manner. Operating with two trays ensures that a substrate may be loaded and unloaded onto a first tray while a second tray remains with a substrate being processed. By loading and unloading a first tray while a second tray remains with a substrate being processed, substrate load and unload times can be reduced, allowing for a greater number of substrates to be processed in a shorter amount of time.

In one embodiment, a processing system comprises a base frame and a lift pin loader coupled to the base frame. The lift pin loader comprises a plurality of lift pins. The lift pin loader is configured to move in a first direction and a second direction opposite the first direction. The processing system further comprises a first tray disposed parallel to the lift pin loader, the first tray being configured to support a first substrate, and a second tray disposed parallel to the lift pin loader. The second tray is spaced from the first tray. The second tray is configured to support a second substrate. The lift pin loader is configured to move in the first direction to place the first substrate on the first tray and the second substrate on the second tray.

The lift pin loader may be configured to move in the second direction to remove the first substrate from the first tray and to remove the second substrate from the second tray. The first tray and the second tray may each comprise one or more tooling balls. The first tray and the second tray may each comprise one or more circular rings. The plurality of lift pins of the lift pin loader may be configured to fit within one or more holes in the first tray and within one or more holes in the second tray. The first tray and the second tray may each comprise one or more interface tabs disposed on a perimeter of the first tray and the second tray.

In another embodiment, a processing system comprises a first set of parallel tracks disposed at a first height and a second set of parallel tracks disposed parallel to the first set of parallel tracks, the second set of parallel tracks being disposed at a second height. The first height is greater than the second height. The processing system further comprises a pair of upper tray exchange modules disposed on the first set of parallel tracks. The pair of upper tray exchange modules is configured to move in a first direction and a second direction opposite the first direction along the first set of parallel tracks to transfer one or more trays from a lift pin loader to a chuck. The processing system further comprises a pair of lower tray exchange modules disposed on the second set of parallel tracks, the pair of lower tray exchange modules being configured to move in the first direction and the second direction along the second set of parallel tracks to transfer the one or more trays from the chuck to the lift pin loader.

The pair of upper tray exchange modules and the pair of lower tray exchange modules may both be configured to move in a third direction and a fourth direction opposite the third direction. The pair of upper tray exchange modules may be configured to move in the third direction and the fourth direction a first distance, and the pair of lower tray exchange modules may be further configured to move in the third direction and the fourth direction a second distance. The first distance may be greater than the second distance. The pair of upper tray exchange modules may transfer the first tray via one or more interface tabs disposed on a perimeter of the first tray. The pair of lower tray exchange modules may transfer the second tray via one or more interface tabs disposed on a perimeter of the second tray. The first set of tracks may have a first width and the second set of tracks may have a second width. The second width may be greater than the first width. The pair of upper tray exchange modules and the pair of lower tray exchange modules may be configured to move simultaneously. The pair of upper tray exchange modules may be configured to transfer a first tray of the one or more trays to the chuck while the pair of lower tray exchange modules may be configured to move a second tray of the one or more trays to the lift pin loader.

In yet another embodiment, a method of processing substrates comprises placing a first substrate on a plurality of lift pins of a lift pin loader, moving the lift pin loader in a first direction to place the first substrate on a first tray, and moving the first tray and the first substrate along a first set of parallel tracks in a second direction using a pair of upper tray exchange modules. The second direction is perpendicular to the first direction. The method further comprises moving the first tray and the first substrate in the first direction to place the first tray and the first substrate on a chuck using the pair of upper tray exchange modules, processing the first substrate, and moving the first tray and the first substrate in a third direction using a pair of lower tray exchange modules to lift the first tray and the first substrate from the chuck. The third direction is opposite the first direction. The method further comprises moving the first tray and the first substrate along a second set of parallel tracks in a fourth direction using the pair of lower tray exchange modules. The fourth direction is opposite the second direction.

The method may further comprise placing a second substrate on the plurality of lift pins of the lift pin loader while processing the first substrate, moving the lift pin loader in the first direction to place the second substrate on a second tray while processing the first substrate, moving the second tray and the second substrate along the first set of parallel tracks in the second direction using the pair of upper tray exchange modules while processing the first substrate, and moving the second tray and the second substrate in the first direction to place the second tray and the second substrate on the chuck using the pair of upper tray exchange modules while moving the first tray and the first substrate along the second set of parallel tracks in the fourth direction.

The method may further comprise moving the lift pin loader in the third direction to lift the first substrate from the first tray using the plurality of lift pins while moving the second tray and the second substrate in the first direction to place the second tray and the second substrate on the chuck. The method may further comprise placing a third substrate on the plurality of lift pins of the lift pin loader after the first substrate has been lifted from the first tray while processing the second substrate, and moving the lift pin loader in the first direction to place the third substrate on the first tray while processing the second substrate.

The first set of parallel tracks may be disposed at a first height and the second set of parallel tracks may be disposed at a second height. The first height may be greater than the second height. The first set of parallel tracks may be disposed parallel to the second set of parallel tracks.

While the foregoing is directed to embodiments of the present disclosure, other and further embodiments of the disclosure may be devised without departing from the basic scope thereof, and the scope thereof is determined by the claims that follow.

What is claimed is:

1. A processing system, comprising:
   a base frame;
   a chuck coupled to the base frame;
   a first set of tracks coupled to the base frame;
   a second set of tracks coupled to the base frame, the second set of tracks being disposed parallel to the first set of tracks;
   a pair of upper tray exchange modules coupled to the first set of tracks, the pair of upper tray exchange modules are configured to move along the first set of tracks and configured to move in a first vertical direction and a second vertical direction opposite the first vertical direction a first distance to individually transfer one or more trays onto the chuck, the first set of tracks each disposed above and within a width of the one or more trays; and
   a pair of lower tray exchange modules coupled to configured to move along the second set of tracks, the second set of tracks distanced apart greater than the width of the one or more trays, the pair of lower tray exchange modules being configured to move in the first and second vertical directions a second distance less than the first distance to individually lift the one or more trays off the chuck, wherein the pair of lower tray exchange modules is further configured to move in a first horizontal direction towards the chuck simultaneously with the pair of upper tray exchange modules configured to move in a second horizontal direction away from the chuck.

2. The processing system of claim 1, further comprising:
   a lift pin loader coupled to a lift pin loader base frame and spaced from the chuck, wherein the lift pin loader base frame is spaced below the base frame, wherein the pair of upper tray exchange modules is further configured to move in the first and second vertical directions the first distance to individually lift the one or more trays off the lift pin loader, and wherein the pair of lower tray exchange modules is further configured to move in the first and second vertical directions the second distance to individually place the one or more trays on the lift pin loader.

3. The processing system of claim 2, wherein the pair of lower tray exchange modules is configured to move in the first vertical direction simultaneously with the pair of upper tray exchange modules moving in another direction that is orthogonal to the first vertical direction.

4. The processing system of claim 1, wherein the one or more trays each comprise one or more interface tabs, the pair of upper tray exchange modules each comprise one or more upper end effectors, the pair of lower tray exchange modules each comprise one or more lower end effectors, wherein the lower end effectors are configured to move the one or more trays using the interface tabs from a second substrate transferring height to a chuck height, the upper end effectors are configured to move the one or more trays using the interface tabs from a first substrate transferring height to the chuck height, and the lower end effectors are configured to move the one or more trays using the interface tabs from the chuck height to the second substrate transferring height.

5. The processing system of claim 4, wherein the chuck height, the first substrate transferring height, and the second substrate transferring height are different from each other.

6. The processing system of claim 4, wherein the upper end effectors and the lower end effectors are configured to move in a plane parallel to the one or more trays.

7. The processing system of claim 1, wherein the pair of upper tray exchange modules further comprise one or more upper end effectors and wherein the pair of lower tray exchange modules further comprise one or more lower end effectors, the one or more upper end effectors being configured to move the first distance and the one or more lower end effectors being configured to move the second distance, the first distance has a maximum greater than a second distance maximum.

8. The processing system of claim 7, wherein each of the one or more upper end effectors are disposed on an outer surface of each of the pair of upper tray exchange modules and wherein each of the one or more lower end effectors are disposed on an inner surface of each of the pair of lower tray exchange modules.

9. A processing system, comprising:
a lift pin loader;
a chuck spaced from the lift pin loader;
a pair of upper tray exchange modules configured to move along a first set of tracks in a first horizontal direction and a second horizontal direction opposite the first horizontal direction to transfer one or more trays from the lift pin loader to the chuck, and to move a first distance in a third direction perpendicular to the first horizontal direction and a fourth direction opposite the third direction; and
a pair of lower tray exchange modules disposed to the pair of upper tray exchange modules, the pair of lower tray exchange modules being configured to move along a second set of tracks in the first horizontal direction and the second horizontal direction to transfer the one or more trays from the chuck to the lift pin loader, and to move a second distance in the third direction and the fourth direction, the second set of tracks are disposed entirely outward, below, and parallel to the first set of tracks, wherein the first distance maximum is greater than the second distance, wherein the pair of lower tray exchange modules is further configured to move in the first horizontal direction simultaneously with the pair of upper tray exchange modules moving in the second horizontal direction and to move in the third direction simultaneously with the pair of upper tray exchange modules moving in the fourth direction.

10. The processing system of claim 9, wherein the pair of upper tray exchange modules is configured to transfer a first tray of the one or more trays from the lift pin loader to the chuck while the pair of lower tray exchange modules transfers a second tray of the one or more trays from the chuck to the lift pin loader.

11. The processing system of claim 10, wherein the pair of upper tray exchange modules is configured to transfer the first tray via one or more interface tabs disposed on a perimeter of the first tray, and wherein the pair of lower tray exchange modules is configured to transfer the second tray via one or more interface tabs disposed on a perimeter of the second tray.

12. The processing system of claim 11, wherein the pair of upper tray exchange modules and the pair of lower tray exchange modules both individually comprise one or more end effectors, wherein the one or more end effectors of each of the pair of upper tray exchange modules and the pair of lower tray exchange modules are configured to contact the one or more interface tabs of the first and second trays.

13. The processing system of claim 12, wherein the one or more end effectors are configured to move in the third direction and the fourth direction when moving the first and second trays, and the end effectors are configured to move in a fifth direction, wherein the fifth direction is perpendicular to the first direction and the third direction, and a sixth direction, opposite the fifth direction, to contact or release the first and second trays.

14. A method of processing substrates, comprising:
transferring a first tray along a first set of tracks in a first direction using a pair of upper tray exchange modules;
transferring, simultaneously with the transferring of the first tray, a second tray along a second set of tracks disposed entirely outward, below, and parallel the first set of tracks in a second direction opposite the first direction using a pair of lower tray exchange modules;
moving the first tray in a third direction a first distance to place the first tray on a chuck using the pair of upper tray exchange modules, the third direction being perpendicular to the first direction; and
moving, simultaneously with the moving of the first tray, the second tray in the third direction a second distance to place the second tray on a lift pin loader using the pair of lower tray exchange modules, the first distance greater than the second distance.

15. The method of claim 14, further comprising:
moving the first tray in a fourth direction opposite the third direction and equal to the second distance using the pair of lower tray exchange modules to lift the first tray from the chuck;
moving, simultaneously with the moving of the first tray in the fourth direction, the second tray in the fourth direction equal to the first distance using the pair of upper tray exchange modules to lift the second tray from the lift pin loader;
transferring the first tray along the second set of tracks in the second direction using the pair of lower tray exchange modules; and transferring, simultaneously with the transferring of the first tray in the second direction, the second tray along the first set of tracks in the first direction using the pair of upper tray exchange modules.

16. The method of claim 14, wherein a first substrate disposed on the first tray is processed after the first tray is placed onto the chuck, and wherein a second substrate is removed from the second tray after the second tray is placed on the lift pin loader.

17. The method of claim 16, wherein a third substrate is placed on the second tray using the lift pin loader after the second substrate is removed.

18. The method of claim 17, further comprising:
moving the lift pin loader in the third direction to lift the second substrate from the second tray using a plurality of lift pins of the lift pin loader; and
moving the lift pin loader in a fourth direction opposite the third direction to place the third substrate on the second tray using the plurality of lift pins.

19. The method of claim 14, wherein the first set of tracks is disposed parallel to the second set of tracks.

20. The method of claim 19, wherein the first set of tracks comprises a first pair of tracks that is disposed at a first height above the lift pin loader and having a first width between each track of the first pair of tracks, and the second set of tracks comprises a second pair of tracks that is disposed at a second height above the lift pin loader and having a second width between each track of the second pair of tracks, the first height being greater than the second height and the first width being greater than the second width.

* * * * *